United States Patent
Lin et al.

(10) Patent No.: US 12,375,038 B2
(45) Date of Patent: Jul. 29, 2025

(54) IMPEDANCE DETECTION METHOD AND PHOTOVOLTAIC SYSTEM

(71) Applicant: Huawei Digital Power Technologies Co., Ltd., Shenzhen (CN)

(72) Inventors: Jianfei Lin, Shenzhen (CN); Yongbing Gao, Shanghai (CN); Tiansan Lin, Shenzhen (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 196 days.

(21) Appl. No.: 18/364,669

(22) Filed: Aug. 3, 2023

(65) Prior Publication Data
US 2023/0378908 A1 Nov. 23, 2023

Related U.S. Application Data

(63) Continuation of application No. PCT/CN2021/075168, filed on Feb. 4, 2021.

(51) Int. Cl.
| | | |
|---|---|---|
| *G01R 27/18* | (2006.01) | |
| *H02J 3/46* | (2006.01) | |
| *H02K 3/46* | (2006.01) | |
| *H02S 40/34* | (2014.01) | |
| *H02S 50/10* | (2014.01) | |

(52) U.S. Cl.
CPC ............. *H02S 50/10* (2014.12); *G01R 27/18* (2013.01); *H02J 3/46* (2013.01); *H02S 40/34* (2014.12); *H02J 2300/26* (2020.01)

(58) Field of Classification Search
CPC ......... Y02E 10/50; Y02E 10/56; H02S 50/00; G01R 31/08; G01R 31/40; G01R 31/52; G05B 9/02; H02H 3/042; H02H 3/16; H02H 7/20

USPC ............... 324/509, 522, 529, 551, 526, 536; 307/82; 361/42; 702/58; 136/244

See application file for complete search history.

(56) References Cited

U.S. PATENT DOCUMENTS

2017/0343593 A1 11/2017 Willenberg et al.

FOREIGN PATENT DOCUMENTS

| CN | 105606897 | A | | 5/2016 | | |
|---|---|---|---|---|---|---|
| CN | 106208129 | A | | 12/2016 | | |
| CN | 108267639 | A | * | 7/2018 | ............. | G01R 27/08 |
| CN | 109600115 | A | | 4/2019 | | |
| CN | 106208129 | B | * | 10/2019 | ............. | G01R 31/08 |
| CN | 109600115 | B | * | 12/2020 | ............. | H02J 3/383 |
| CN | 112311328 | A | * | 2/2021 | ........... | G01R 27/025 |

* cited by examiner

*Primary Examiner* — Elim Ortiz
(74) *Attorney, Agent, or Firm* — Maier & Maier, PLLC

(57) ABSTRACT

An impedance detection method and a photovoltaic system are provided to help reduce complexity and costs of impedance detection. The method includes: sampling a voltage between a direct current bus and a protective earthing at each of a first time point and a second time point, to obtain a first voltage value and a second voltage value; sampling a leakage current on the direct current bus at each of the first time point and the second time point, to obtain a first current value and a second current value; and calculating an insulation impedance value of a combiner box based on a difference between the first voltage value and the second voltage value and a difference between the first current value and the second current value, to determine whether impedance of the combiner box is abnormal.

18 Claims, 17 Drawing Sheets

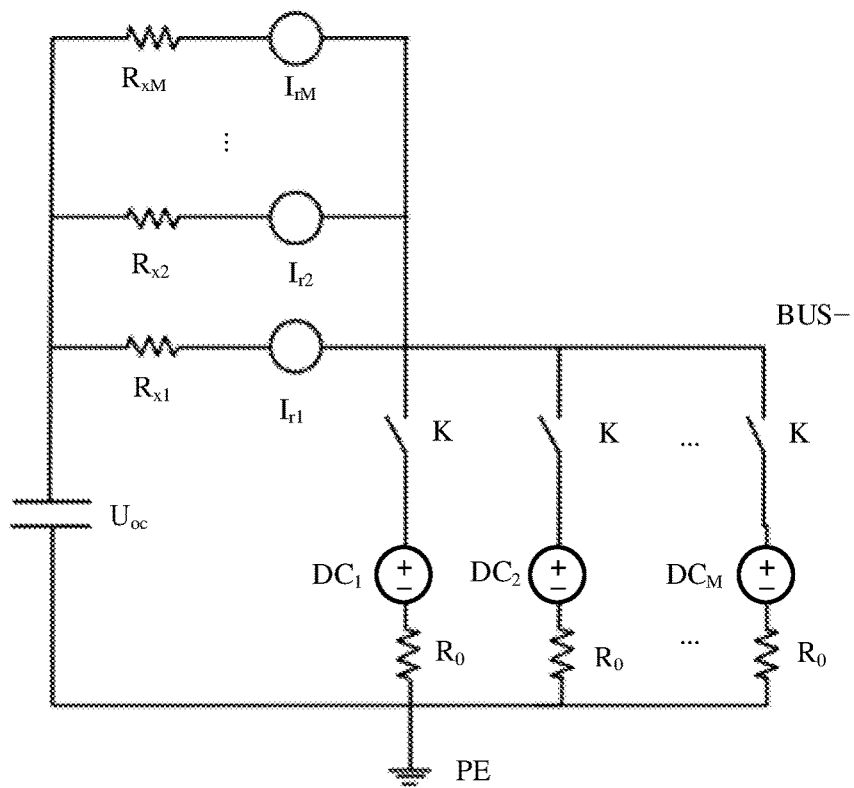

| Sample a voltage between a direct current bus and a protective earthing at each of a first time point and a second time point, to obtain a first voltage value and a second voltage value | S801 |

| Sample a leakage current on the direct current bus at each of the first time point and the second time point, to obtain a first current value and a second current value | S802 |

| Calculate an insulation impedance value of a combiner box based on a difference between the first voltage value and the second voltage value and a difference between the first current value and the second current value, to determine whether impedance of the combiner box is abnormal | S803 |

| Sample a voltage between a direct current bus and a protective earthing at each of a first time point and a second time point, to obtain a first voltage value and a second voltage value | S801 |

| Sample a leakage current on the direct current bus at each of the first time point and the second time point, to obtain a first current value and a second current value | S802 |

| Calculate an insulation impedance value of a combiner box based on a difference between the first voltage value and the second voltage value and a difference between the first current value and the second current value, to determine whether impedance of the combiner box is abnormal | S803 |

| If it is determined that the impedance of the combiner box is abnormal, adjust a maximum power point tracking MPPT voltage corresponding to a photovoltaic string in the combiner box | S1110 |

| Sample the MPPT voltage at each of a third time point and a fourth time point, to obtain a first MPPT voltage value and a second MPPT voltage value | S1120 |

| Sample the voltage between the direct current bus and the protective earthing at each of the third time point and the fourth time point, to obtain a third voltage value and a fourth voltage value | S1130 |

| Calculate an insulation impedance value of the MPPT voltage based on the first MPPT voltage value, the second MPPT voltage value, the third voltage value, and the fourth voltage value, to determine whether impedance of the photovoltaic string is abnormal | S1140 |

FIG. 11

IMPEDANCE DETECTION METHOD AND PHOTOVOLTAIC SYSTEM

CROSS-REFERENCE TO RELATED APPLICATIONS

This application is a continuation of International application No. PCT/CN2021/075168, filed on Feb. 4, 2021, the disclosure of which is hereby incorporated by reference in its entirety.

TECHNICAL FIELD

The embodiments relate to the electronic field, an impedance detection method, and a photovoltaic system.

BACKGROUND

In a distributed inverter grid-connected power generation system, a plurality of combiner boxes may be directly connected in parallel to a direct current bus of an inverter through a direct current-to-direct current (DC-DC) boost circuit. When insulation impedance of a photovoltaic string in a combiner box to the ground is low, the inverter detects, through an insulation impedance detection circuit, that insulation impedance of the system does not meet a safety requirement, and a shutdown operation needs to be performed. Consequently, all the combiner boxes connected in parallel to the direct current bus of the inverter cannot work, resulting in a loss of an energy yield of the inverter.

Currently, different direct current cabinets may be connected in series to direct current switches, and the insulation impedance of the system is separately detected by controlling the direct current switch to be turned off. A direct current switch of a combiner box that is detected to be normal may be turned on, and a direct current switch of a combiner box that is detected to be abnormal may be turned off.

However, in the method, a direct current contactor needs to be used to control the switch to be turned off and turned on. This is high in cost and complex in control.

SUMMARY

The embodiments may provide an impedance detection method and a photovoltaic system, to implement insulation impedance abnormality detection of a combiner box with a simple operation and low costs.

According to a first aspect, an impedance detection method is provided, and is applied to a photovoltaic system. The photovoltaic system includes a plurality of combiner boxes and an inverter. An input end of each of the plurality of combiner boxes is connected to a photovoltaic string, and output ends of the plurality of combiner boxes are connected to the inverter by using a direct current bus. The combiner box includes at least one direct current switch and at least one DC-DC boost unit. An input end of the direct current switch is connected to the photovoltaic string, an output end of the direct current switch is connected to an input end of the DC-DC boost unit, and an output end of the DC-DC boost unit is connected to the direct current bus. The method includes:

sampling a voltage between the direct current bus and a protective earthing (PE) at each of a first time point and a second time point, to obtain a first voltage value and a second voltage value; sampling a leakage current on the direct current bus at each of the first time point and the second time point, to obtain a first current value and a second current value; and calculating an insulation impedance value of the combiner box based on a difference between the first voltage value and the second voltage value and a difference between the first current value and the second current value, to determine whether impedance of the combiner box is abnormal.

It should be understood that the combiner box in this embodiment may have a voltage control function and may be connected to a plurality of photovoltaic strings connected in parallel. The photovoltaic string is obtained by connecting at least one photovoltaic cell in series.

In this embodiment, the first voltage value and the second voltage value between the direct current bus and the protective earthing and the first current value and the second current value corresponding to the first voltage value and the second voltage value may be obtained through sampling. Therefore, impedance of each combiner box to the ground can be calculated, and a combiner box with abnormal impedance can be located. This helps reduce complexity and costs of impedance detection and improve efficiency of impedance detection.

With reference to the first aspect, in some implementations of the first aspect, the photovoltaic system further includes a power supply unit, one end of the power supply unit is grounded, the other end of the power supply unit is connected to the direct current bus, the power supply unit is in an off state at the first time point, and the power supply unit is in a working state at the second time point.

In this embodiment, a voltage between a negative direct current bus BUS− and the protective earthing PE (which is briefly referred to as BUS−/PE below) and the leakage current on the direct current bus are first sampled at the first time point at which the power supply unit is in the off state, and then the BUS−/PE voltage and the leakage current on the direct current bus are sampled at the second time point at which the power supply unit is in the working state. In this way, a change of the BUS−/PE voltage of each combiner box and a change of the current on the direct current bus can be obtained by changing a switching state of the power supply unit.

With reference to the first aspect, in some implementations of the first aspect, before the obtaining a second voltage value and the obtaining a second current value, the method further includes: turning on the power supply unit, so that the power supply unit is in the working state; and adjusting the voltage between the direct current bus and the protective earthing to a first preset voltage by using the power supply unit.

It should be understood that in this embodiment, the first voltage value and the first current value are obtained through sampling when the power supply unit is in the off state, and the second voltage value and the second current value are obtained through sampling when the power supply unit is in the working state.

In this embodiment, when the power supply unit is in the working state, the BUS−/PE voltage may be first adjusted to the first preset voltage, and after the first preset voltage is stable, the first preset voltage is sampled, to obtain the second voltage value and the second current value. In this way, the insulation impedance value of the combiner box to the ground can be accurately calculated, to improve accuracy of impedance detection.

With reference to the first aspect, in some implementations of the first aspect, the photovoltaic system further includes a power supply unit, one end of the power supply unit is grounded, the other end of the power supply unit is connected to the direct current bus, and the power supply unit is in a working state at both the first time point and the second time point.

In this embodiment, the BUS−/PE voltage and the leakage current on the direct current bus are sampled twice when the power supply unit is in the working state, to obtain two different BUS−/PE voltages and two different leakage currents on the direct current bus through sampling at two different time points when the power supply unit is in the working state. In this way, a change of the BUS−/PE voltage of each combiner box and a change of the current on the direct current bus can be obtained.

With reference to the first aspect, in some implementations of the first aspect, before the obtaining a first voltage value and the obtaining a first current value, the method further includes: turning on the power supply unit, so that the power supply unit is in the working state; and adjusting the voltage between the direct current bus and the protective earthing to a second preset voltage by using the power supply unit.

It should be understood that in this embodiment, the first voltage value and the first current value are obtained through sampling when the power supply unit is in the working state.

In this embodiment, when the power supply unit is in the working state, the BUS−/PE voltage may be first adjusted to the second preset voltage, and after the second preset voltage is stable, the second preset voltage is sampled, to obtain the first voltage value and the first current value. In this way, the insulation impedance value of the combiner box to the ground can be accurately calculated, to improve accuracy of impedance detection.

With reference to the first aspect, in some implementations of the first aspect, the method further includes: adjusting the voltage between the direct current bus and the protective earthing to a third preset voltage by using the power supply unit after first preset duration.

It should be understood that in this embodiment, the second voltage value and the second current value are obtained through sampling when the power supply unit is in the working state.

In this embodiment, when the power supply unit is in the working state, the BUS−/PE voltage may be first adjusted to the third preset voltage, and after the third preset voltage is stable, the third preset voltage is sampled, to obtain the second voltage value and the second current value. In this way, the insulation impedance value of the combiner box to the ground can be accurately calculated, to improve accuracy of impedance detection.

With reference to the first aspect, in some implementations of the first aspect, the method further includes: if it is determined that the impedance of the combiner box is abnormal, adjusting a maximum power point tracking (MPPT) voltage corresponding to the photovoltaic string in the combiner box; sampling the MPPT voltage at each of a third time point and a fourth time point, to obtain a first MPPT voltage value and a second MPPT voltage value; sampling the voltage between the direct current bus and the protective earthing at each of the third time point and the fourth time point, to obtain a third voltage value and a fourth voltage value; and calculating an insulation impedance value of the MPPT voltage based on the first MPPT voltage value, the second MPPT voltage value, the third voltage value, and the fourth voltage value, to determine whether impedance of the photovoltaic string is abnormal.

Further, in this embodiment, after it is determined that impedance of a combiner box is abnormal, an input end of the DC-DC boost unit whose positive end has abnormal impedance to the ground in the abnormal combiner box may be located. In this way, location is more accurate and efficient.

With reference to the first aspect, in some implementations of the first aspect, before the obtaining a first MPPT voltage and the obtaining a third voltage value, the method further includes: adjusting the MPPT voltage to a fourth preset voltage by using the DC-DC boost unit.

In this embodiment, the MPPT voltage is first adjusted to the fourth preset voltage, and after the fourth preset voltage is stable, the fourth preset voltage is sampled, to obtain the first MPPT voltage and the third voltage value. In this way, the insulation impedance value of the MPPT voltage to the ground can be accurately calculated, to improve accuracy of impedance detection.

With reference to the first aspect, in some implementations of the first aspect, the method further includes: adjusting the MPPT voltage to a fifth preset voltage by using the DC-DC boost unit after second preset duration.

In this embodiment, the MPPT voltage is first adjusted to the fifth preset voltage, and after the fifth preset voltage is stable, the fifth preset voltage is sampled, to obtain the second MPPT voltage and the fourth voltage value. In this way, the insulation impedance value of the MPPT voltage to the ground can be accurately calculated, to improve accuracy of impedance detection.

With reference to the first aspect, in some implementations of the first aspect, the power supply unit includes at least one of a relay, a resistor, a diode, or a direct current power supply.

It should be understood that the resistor may be an output resistor, the relay may be an output relay, and the relay is configured to control the power supply unit to be turned off and turned on, to control the power supply unit to be in the off state or the working state.

According to a second aspect, a photovoltaic system is provided, and includes a plurality of combiner boxes, an inverter, and an impedance detection apparatus. An input end of each of the plurality of combiner boxes is connected to a photovoltaic string, and the plurality of combiner boxes are connected to the inverter by using a direct current bus. The combiner box includes at least one direct current switch and at least one DC-DC boost unit. An input end of the direct current switch is connected to the photovoltaic string, an output end of the direct current switch is connected to an input end of the DC-DC boost unit, and an output end of the DC-DC boost unit is connected to the direct current bus.

The impedance detection apparatus is configured to: sample a voltage between the direct current bus and a protective earthing at each of a first time point and a second time point, to obtain a first voltage value and a second voltage value; and sample a leakage current on the direct current bus at each of the first time point and the second time point, to obtain a first current value and a second current value; and calculate an insulation impedance value of the combiner box based on a difference between the first voltage value and the second voltage value and a difference between the first current value and the second current value, to determine whether impedance of the combiner box is abnormal.

With reference to the second aspect, in some implementations of the second aspect, the photovoltaic system further includes a power supply unit, one end of the power supply unit is grounded, the other end of the power supply unit is connected to the direct current bus, the power supply unit is in an off state at the first time point, and the power supply unit is in a working state at the second time point.

With reference to the second aspect, in some implementations of the second aspect, the impedance detection apparatus is configured to: turn on the power supply unit before the second voltage value and the second current value are obtained, so that the power supply unit is in the working state; and adjust the voltage between the direct current bus and the protective earthing to a first preset voltage.

With reference to the second aspect, in some implementations of the second aspect, the photovoltaic system further includes a power supply unit, one end of the power supply unit is grounded, the other end of the power supply unit is connected to the direct current bus, and the power supply unit is in a working state at both the first time point and the second time point.

With reference to the second aspect, in some implementations of the second aspect, the impedance detection apparatus is configured to: turn on the power supply unit before the first voltage value and the first current value are obtained, so that the power supply unit is in the working state; and adjust the voltage between the direct current bus and the protective earthing to a second preset voltage.

With reference to the second aspect, in some implementations of the second aspect, the impedance detection apparatus is configured to adjust the voltage between the direct current bus and the protective earthing to a third preset voltage after first preset duration.

With reference to the second aspect, in some implementations of the second aspect, the impedance detection apparatus is configured to: if it is determined that the impedance of the combiner box is abnormal, adjust a maximum power point tracking (MPPT) voltage corresponding to the photovoltaic string in the combiner box; sample the MPPT voltage at each of a third time point and a fourth time point, to obtain a first MPPT voltage value and a second MPPT voltage value; and sample the voltage between the direct current bus and the protective earthing at each of the third time point and the fourth time point, to obtain a third voltage value and a fourth voltage value; and calculate an insulation impedance value of the MPPT voltage based on the first MPPT voltage value, the second MPPT voltage value, the third voltage value, and the fourth voltage value, to determine whether impedance of the photovoltaic string is abnormal.

With reference to the second aspect, in some implementations of the second aspect, the impedance detection apparatus is configured to adjust the MPPT voltage to a fourth preset voltage before the first MPPT voltage and the third voltage value are obtained.

With reference to the second aspect, in some implementations of the second aspect, the impedance detection apparatus is configured to adjust the MPPT voltage to a fifth preset voltage after second preset duration.

With reference to the second aspect, in some implementations of the second aspect, the power supply unit includes at least one of a relay, a resistor, a diode, or a direct current power supply.

According to a third aspect, an impedance detection apparatus is provided. The impedance detection apparatus may be an electronic device or may be a chip or a chip system in an electronic device. The impedance detection apparatus may include a sensor detection unit and a processing unit. The sensor detection unit may be a residual current device (RCD) sensor.

When the impedance detection apparatus is an electronic device, the processing unit may be a processor. The impedance detection apparatus may further include a storage unit, and the storage unit may be a memory. The storage unit is configured to store instructions, and the processing unit executes the instructions stored in the storage unit, so that the electronic device implements the impedance detection method described in any one of the first aspect or the possible implementations of the first aspect.

When the impedance detection apparatus is a chip or a chip system in an electronic device, the processing unit may be a processor. The processing unit executes instructions stored in a storage unit, so that the electronic device implements the impedance detection method described in any one of the first aspect or the possible implementations of the first aspect. The storage unit may be a storage unit (for example, a register or a cache) in the chip, or may be a storage unit (for example, a read-only memory or a random access memory), in the electronic device, located outside the chip.

According to a fourth aspect, an impedance detection apparatus is provided, and includes at least one processor and an interface. The interface is configured to provide program instructions or data to the at least one processor. The at least one processor is configured to execute the program instructions, so that the impedance detection apparatus performs the method in any possible implementation of the first aspect.

Optionally, the impedance detection apparatus in the fourth aspect may further include a memory. The processor may invoke a program in the memory. Further, the memory may be integrated with the processor, or the memory and the processor may be separately disposed.

In an implementation process, the memory may be a non-transitory memory, for example, a read-only memory (ROM). The memory and the processor may be integrated into one chip or may be separately disposed on different chips. A type of the memory and a manner of disposing the memory and the processor are not limited in this embodiment.

It should be understood that a related data exchange process such as sending indication information may be a process of outputting the indication information from the processor, and receiving capability information may be a process of receiving the input capability information by the processor. Data output by the processor may be output to a transmitter, and input data received by the processor may be from a receiver. The transmitter and the receiver may be collectively referred to as a transceiver.

According to a fifth aspect, a chip or a chip system is provided. The chip or the chip system includes at least one processor and a communication interface. The communication interface and the at least one processor are interconnected by using a line, and the at least one processor is configured to run a computer program or instructions, to perform the method in any possible implementation of the first aspect.

According to a sixth aspect, a computer program product is provided. The computer program product includes a computer program (which may also be referred to as code or instructions). When the computer program is run, a computer is enabled to perform the method in any possible implementation of the first aspect.

According to a seventh aspect, a non-transitory computer-readable storage medium is provided. The non-transitory computer-readable storage medium stores a computer program (which may also be referred to as code or instructions). When the computer program is run on a computer, the computer is enabled to perform the method in any possible implementation of the first aspect.

BRIEF DESCRIPTION OF THE DRAWINGS

FIG. 7 is a schematic diagram of a multi-machine parallel Thevenin equivalent circuit according to an embodiment;

FIG. 8 is a schematic flowchart of an impedance detection method according to an embodiment;

FIG. 11 is a schematic flowchart of yet another impedance detection method according to an embodiment;

DETAILED DESCRIPTION OF THE EMBODIMENTS

The embodiments are described below with reference to the accompanying drawings.

For ease of describing the embodiments, the following descriptions are first provided.

First, in the embodiments shown below, terms and English acronyms and abbreviations such as a photovoltaic panel and a combiner box are examples provided for ease of description and shall not constitute any limitation. The embodiments do not exclude a possibility of defining another term that can implement a same or similar function in an existing or future protocol.

Second, the terms "first", "second", and various numbers in the embodiments shown below are merely used for distinction for ease of description and are not intended to limit the scope of the embodiments. For example, different voltage values and different time points are distinguished.

Third, "at least one" means one or more, and "a plurality of" means two or more. The term "and/or" describes an association relationship between associated objects and indicates that three relationships may exist. For example, A and/or B may indicate the following three cases: only A exists, both A and B exist, and only B exists, where A and B may be singular or plural. The character "/" may indicate an "or" relationship between associated objects. "At least one of the following items (pieces)" or a similar expression thereof refers to any combination of these items, including a single item (piece) or any combination of a plurality of items (pieces). For example, at least one of a, b, and c may indicate a, b, c, a and b, a and c, b and c, or a, b, and c, where a, b, and c may be singular or plural.

Figure 1:
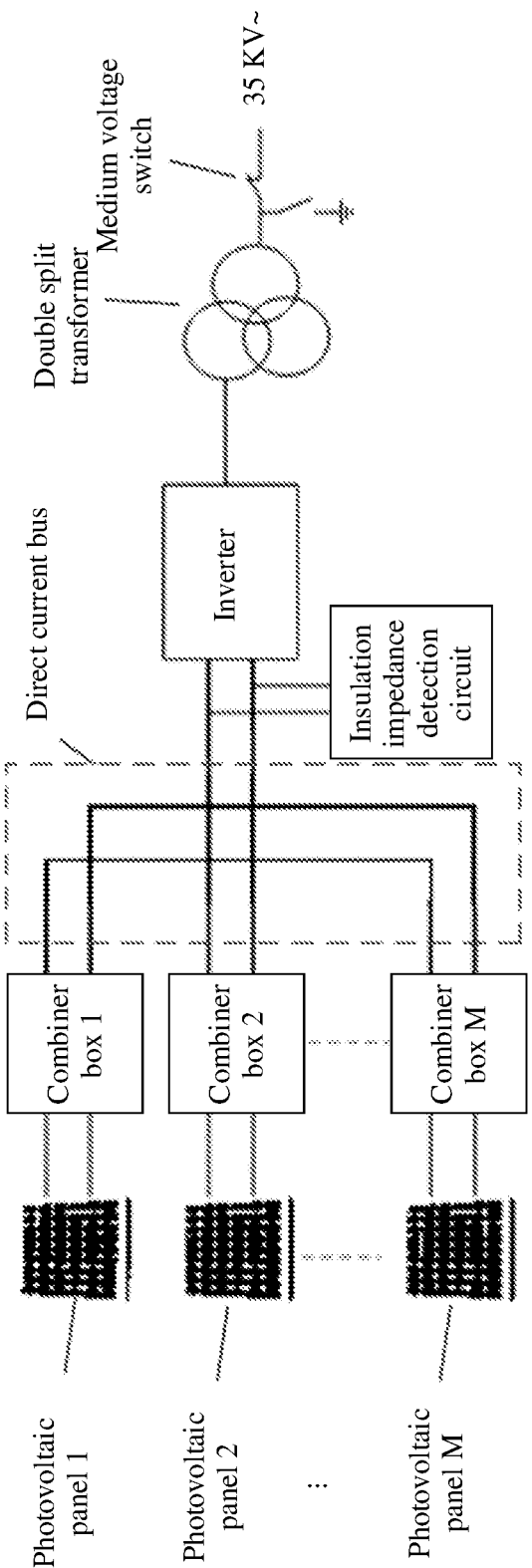
FIG. 1 is a circuit topology diagram of a photovoltaic system according to an embodiment.

The embodiments may be applied to a distributed inverter multi-machine grid-connected power generation system (which is also referred to as a photovoltaic system below). For example, FIG. 1 is a circuit topology diagram of a photovoltaic system according to an embodiment. As shown in FIG. 1, M combiner boxes are connected in parallel to a direct current bus of an inverter, and each combiner box is connected to one photovoltaic panel. The photovoltaic panel is a square array formed by connecting a plurality of photovoltaic strings in parallel. The combiner box combines direct currents, and outputs a combined current to the inverter. The inverter performs maximum power point tracking (MPPT) control, and outputs an alternating current obtained after inversion to a transformer (for example, a double split transformer). Finally, the transformer correspondingly transforms an alternating current voltage, and transmits the alternating current voltage to an alternating current power grid, to meet a power requirement of a load.

It should be understood that the photovoltaic string is formed by connecting a plurality of photovoltaic cells with a low voltage in series, which may multiply a voltage. For the photovoltaic panel formed by connecting a plurality of photovoltaic strings in parallel, a current may be multiplied while there is a same voltage.

In the photovoltaic system, the inverter may be configured to implement MPPT control and inversion functions. A medium voltage switch is connected to the inverter, and may be used to turn on, turn off, control, and protect an electric device in a process of power generation, transmission, and distribution in the system.

In a photovoltaic inverter technology, there are safety requirements in most photovoltaic inverter grid-connected power generation technology standards. It is required to detect an insulation impedance value of a combiner box to the ground before grid-connected power generation and compare the detected insulation impedance value with a minimum impedance value required in the standard, to determine whether the insulation impedance value of the combiner box to the ground meets a safety grid connection requirement.

It should be understood that impedance includes resistance and reactance. The impedance may be a complex number, and the resistance and the reactance respectively form a real part and an imaginary part of the complex number. The insulation impedance of the combiner box to the ground may be a pure resistance value or may include inductive reactance or capacitive reactance.

In FIG. 1, an insulation impedance detection circuit is connected to the direct current bus of the inverter and is configured to detect whether insulation impedance of the M combiner boxes to the ground is abnormal. When the inverter detects, through the insulation detection circuit, that insulation impedance of one or more of the M combiner boxes to the ground is abnormal, a shutdown operation needs to be performed. Consequently, all the combiner boxes connected in parallel to the direct current bus of the inverter cannot work, resulting in a loss of an energy yield.

Figure 2:
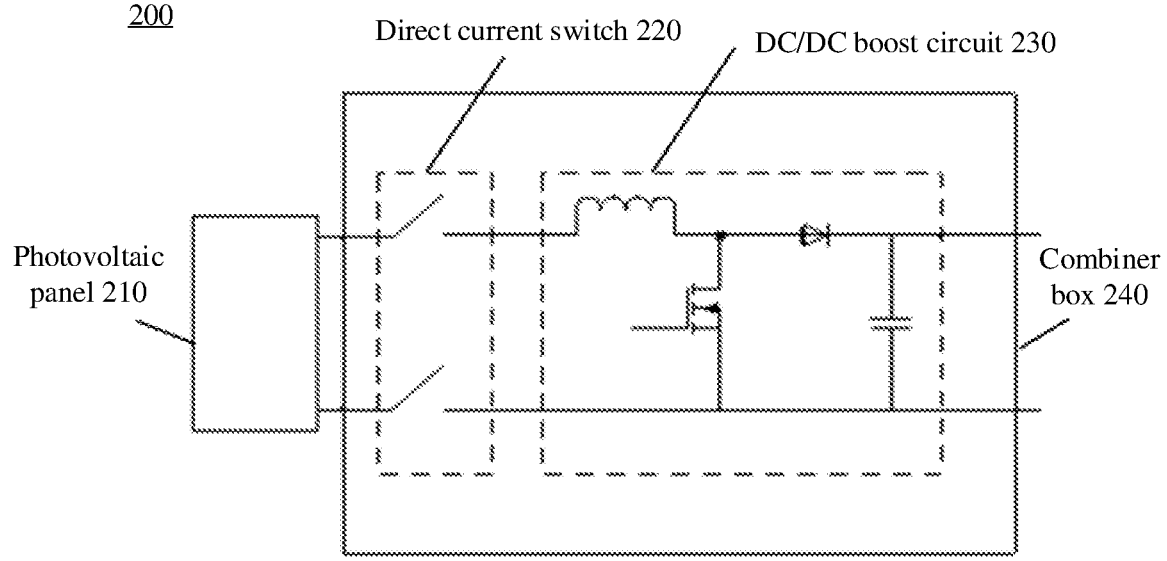
FIG. 2 is a schematic diagram of an internal circuit of a combiner box according to an embodiment.

FIG. 2 is a schematic diagram of an internal circuit 200 of a combiner box according to an embodiment. As shown in FIG. 2, the circuit 200 includes a direct current switch 220 and a DC-DC boost circuit 230. A photovoltaic panel 210 is connected to one end of the direct current switch 220 in the combiner box 240, and the other end of the direct current switch 220 is connected to the DC-DC boost circuit 230.

The photovoltaic panel 210 is formed by connecting N photovoltaic strings in parallel. A photovoltaic cell may convert solar radiation light into electric energy by using a semiconductor material and a photoelectric conversion principle. Compared with a common battery, the photovoltaic cell is more energy-saving and environmental-friendly.

The direct current switch 220 may be a circuit protection device, may include a conductive part, an arc extinguishing part, an operation part, a rotating part, and the like, may perform operations such as switching off and switching on, and may perform a protection tripping function in case of a short circuit, overload, and a reverse current.

The DC-DC boost circuit 230 is a circuit commonly used in a DC-DC converter and may perform a function of boosting a voltage. To implement maximum power point tracking (MPPT), a DC-DC converter may need to be used at an upstream of an inverter, to convert a changing photovoltaic (PV) voltage into a stable output voltage for a downstream inverter to perform a direct current-to-alternating current DC/AC operation.

Figure 3:
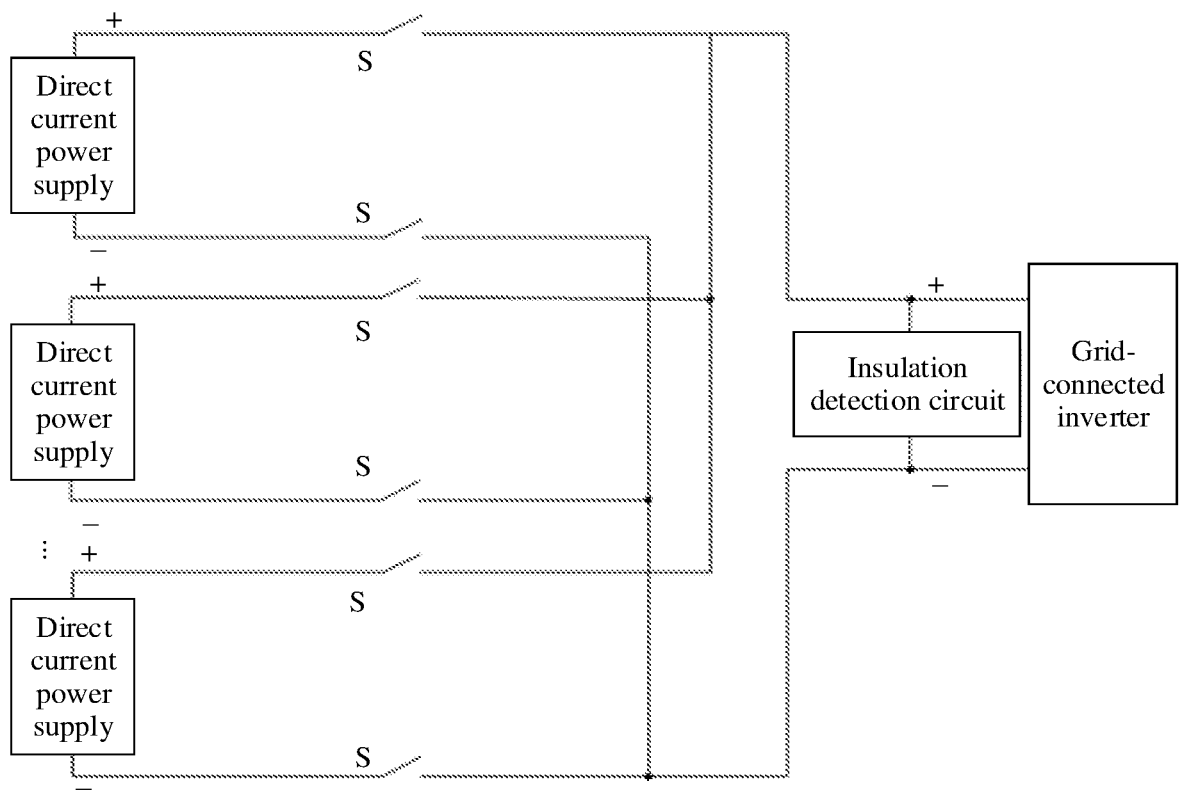
FIG. 3 is a circuit topology diagram of another photovoltaic system according to an embodiment.

In a possible implementation, each combiner box shown in FIG. 1 may be detected by using a controllable switch. FIG. 3 is a circuit topology diagram of another photovoltaic system according to an embodiment. As shown in FIG. 3, a plurality of direct current power supplies may be connected in series to controllable switches S, and the controllable switches S are connected to combiner boxes, or a plurality of direct current power supplies and controllable switches S are integrated into combiner boxes. It should be understood that the combiner box is not shown in FIG. 3. When insulation impedance of the combiner box to the ground is detected, each combiner box may be separately detected by controlling the switch S to be turned off and turned on. A switch of a combiner box that is detected to be normal is turned on, and a switch of a combiner box that is detected to be abnormal is turned off, to ensure that a case in which another integrated machine cannot normally work due to an abnormal combiner box is avoided.

In the possible implementation, a direct current controller needs to be used to control the switch S to be turned on and turned off. However, the direct current controller is high in cost, large in size, and complex in control, and is difficult to produce.

In view of this, the embodiments may provide an impedance detection method and a photovoltaic system. A power supply unit and a sensor detection unit are added to a combiner box, to implement insulation impedance abnormality detection of the combiner box with a simple operation and low costs. In addition, a photovoltaic string whose impedance to the ground is abnormal may be further detected by adjusting an MPPT voltage. In this way, an abnormal component of a grid-connected inverter can be quickly and accurately repaired, to help reduce a loss of an energy yield.

Figure 4A:
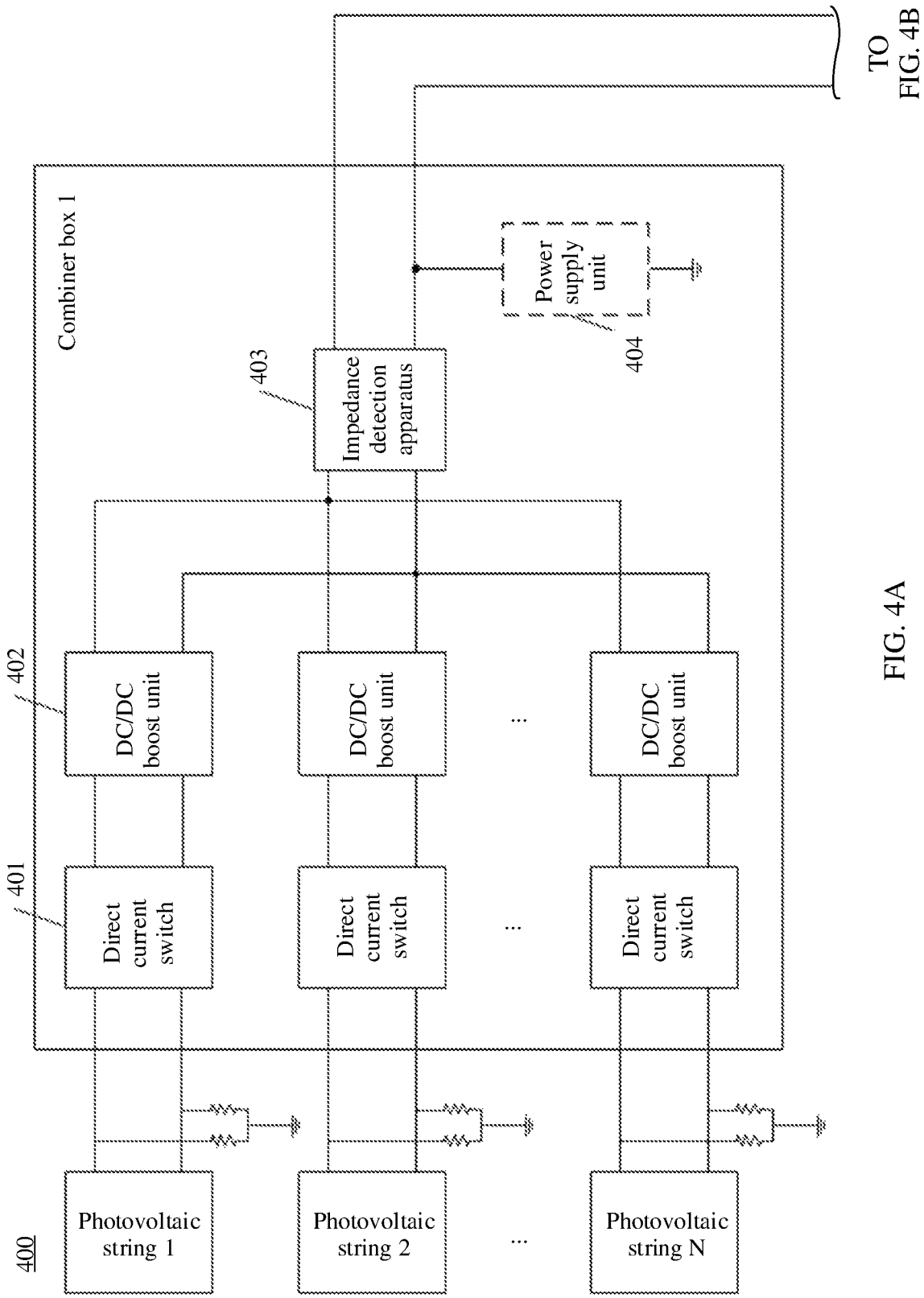
FIG. 4A, FIG. 4B, and FIG. 4C are a circuit topology diagram of still another photovoltaic system according to an embodiment.
Figure 4B:
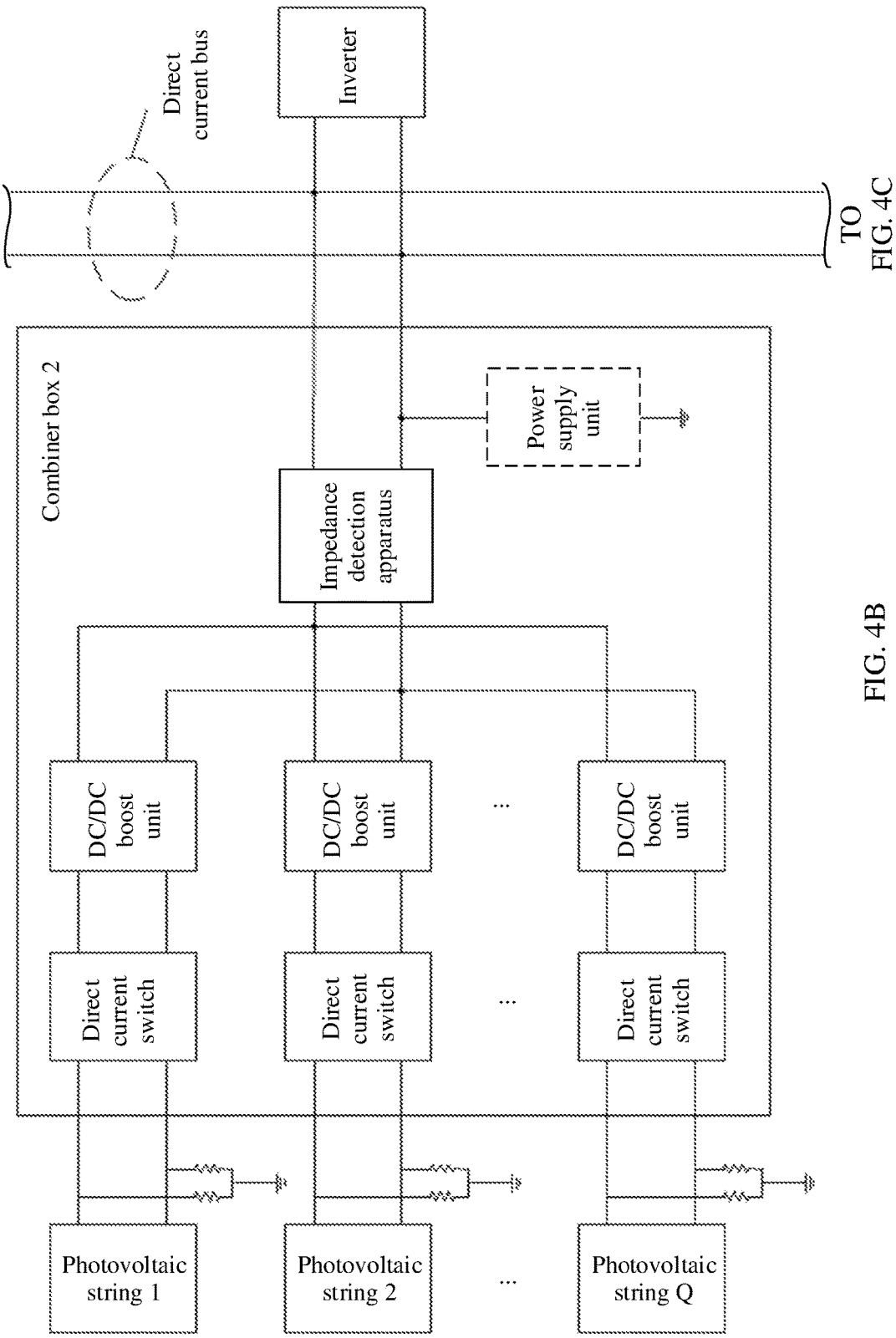
Figure 4C:
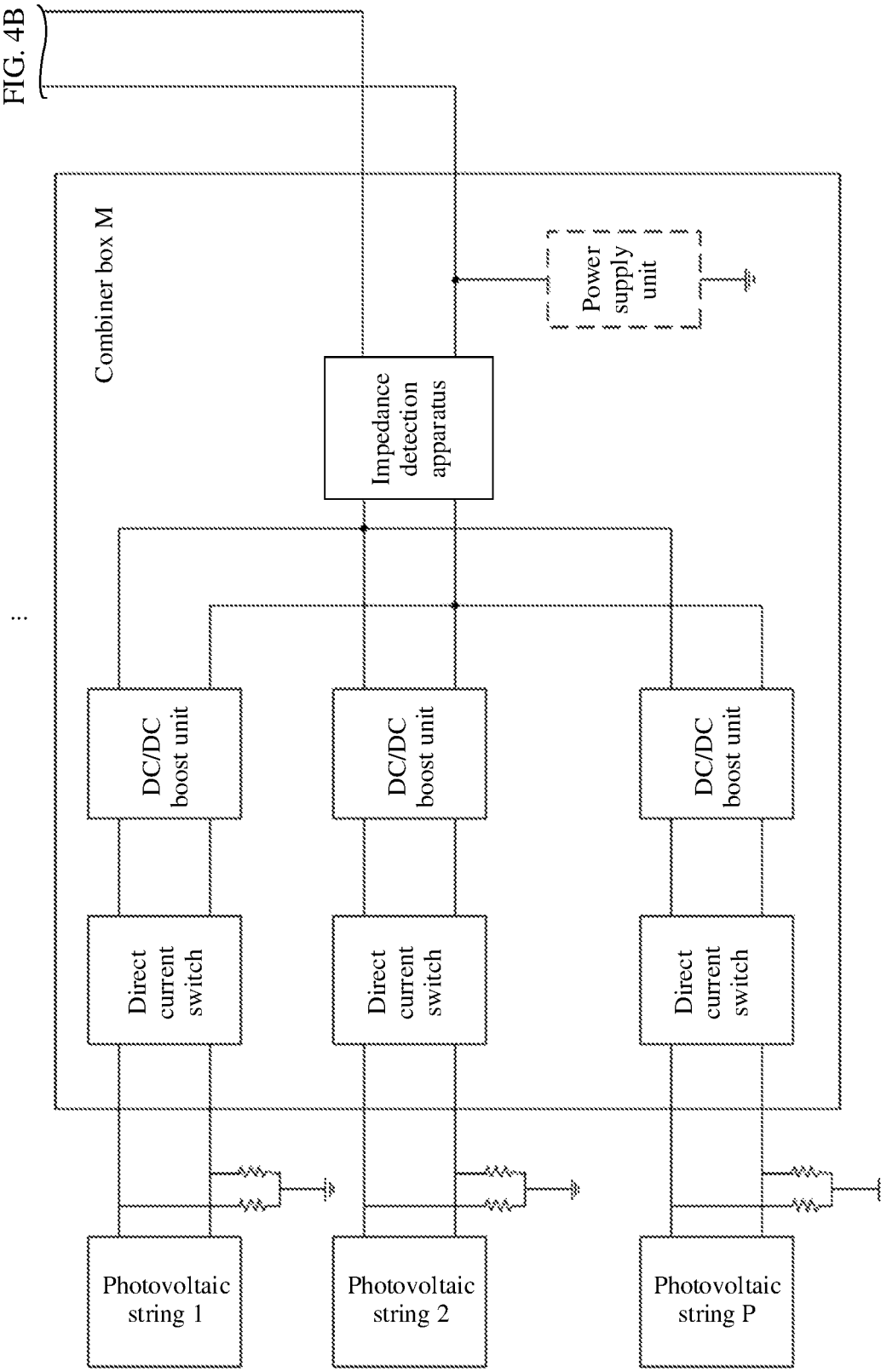

For example, FIG. 4A, FIG. 4B, and FIG. 4C are a circuit topology diagram of still another photovoltaic system 400 according to an embodiment. As shown in FIG. 4A, FIG. 4B, and FIG. 4C, the photovoltaic system 400 includes M combiner boxes (a combiner box 1, a combiner box 2, ..., and a combiner box M) connected in parallel to an inverter. For example, the combiner box 1 is connected to N photovoltaic strings connected in parallel, the combiner box 2 is connected to Q photovoltaic strings connected in parallel, ..., and the combiner box M is connected to P photovoltaic strings connected in parallel. Values of N, Q, and P are all greater than or equal to 1, and the values of N, Q, and P may be the same or different, or the values of any two of N, Q, and P may be the same. This is not limited.

In FIG. 4A, FIG. 4B, and FIG. 4C, the M combiner boxes are connected in parallel to the inverter. It should be understood that the M combiner boxes may alternatively be connected in series to the inverter or may be connected to the inverter in a manner in which some combiner boxes are connected in parallel and the other combiner boxes are connected in series to the inverter. All the combiner boxes may be connected to a same quantity or different quantities of photovoltaic strings. This is not limited in this embodiment.

In this embodiment, a direct current contactor is not used to control a controllable switch, but a direct current switch built in the inverter is used. In this way, an operation is simple, costs can be reduced, and it is easy to implement productization.

Figure 5:
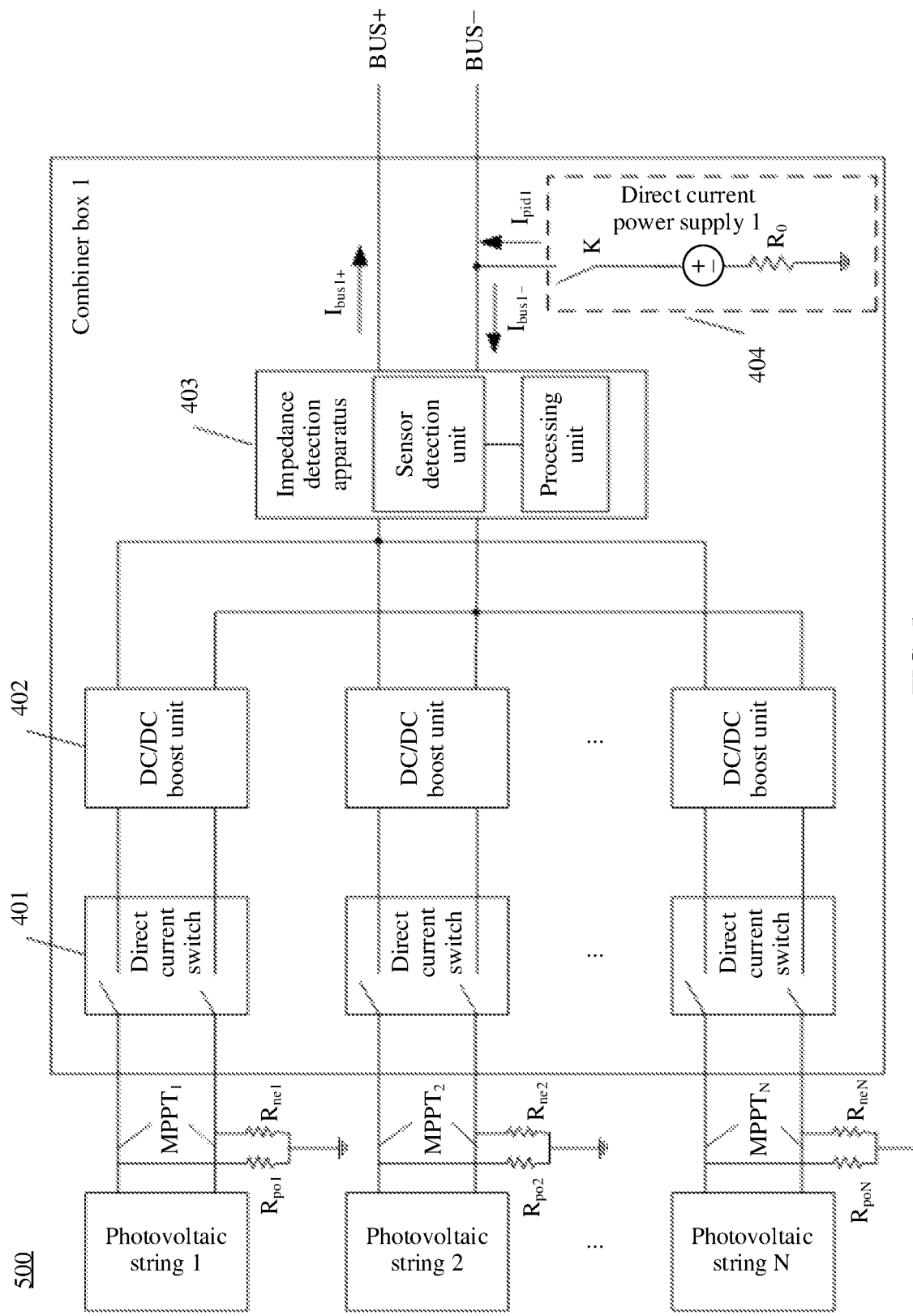
FIG. 5 is a circuit topology diagram of yet another photovoltaic system according to an embodiment.

For ease of description, the combiner box 1 is used as an example below for analysis. A circuit structure and an analysis process of another combiner box are the same as those of the combiner box 1. For example, FIG. 5 is a circuit topology diagram of yet another photovoltaic system 500 according to an embodiment. The photovoltaic system 500 is described by using the combiner box 1 in the photovoltaic system 400 as an example.

As shown in FIG. 5, in the photovoltaic system 500, N photovoltaic strings are connected to an input end of the combiner box 1, and the combiner box 1 includes N direct current switches 401, N DC-DC boost units 402, and an impedance detection apparatus 403. An input end of the direct current switch 401 is connected to the photovoltaic string, an output end of the direct current switch 401 is connected to an input end of the DC-DC boost unit 402, an output end of the DC-DC boost unit 402 is connected to an input end of the impedance detection apparatus, and an output end of the impedance detection apparatus is connected to a direct current bus.

Optionally, the photovoltaic system 500 includes a power supply unit 404, one end of the power supply unit is grounded, and the other end of the power supply unit is connected to the direct current bus.

The impedance detection apparatus 403 includes a sensor detection unit and a processing unit. The sensor detection unit may be a current sensor, an RCD sensor, or a resistor. It should be understood that the impedance detection apparatus 403 may be located inside the combiner box or may be located outside the combiner box. This is not limited in this embodiment.

The impedance detection apparatus is configured to: sample a voltage between the direct current bus and a protective earthing at each of a first time point and a second time point, to obtain a first voltage value and a second voltage value; and sample a leakage current on the direct current bus at each of the first time point and the second time point, to obtain a first current value and a second current value; and calculate an insulation impedance value of the combiner box based on a difference between the first voltage value and the second voltage value and a difference between the first current value and the second current value, to determine whether impedance of the combiner box is abnormal.

Optionally, the photovoltaic system 500 further includes a power supply unit 404, one end of the power supply unit 404 is grounded, the other end of the power supply unit is connected to the direct current bus, the power supply unit is in an off state at the first time point, and the power supply unit is in a working state at the second time point.

Optionally, the impedance detection apparatus is configured to: turn on the power supply unit before the second voltage value and the second current value are obtained, so that the power supply unit is in the working state; and adjust the voltage between the direct current bus and the protective earthing to a first preset voltage.

Optionally, the photovoltaic system further includes a power supply unit, one end of the power supply unit is grounded, the other end of the power supply unit is connected to the direct current bus, and the power supply unit is in a working state at both the first time point and the second time point.

Optionally, the impedance detection apparatus is configured to: turn on the power supply unit before the first voltage value and the first current value are obtained, so that the power supply unit is in the working state; and adjust the voltage between the direct current bus and the protective earthing to a second preset voltage.

Optionally, the impedance detection apparatus is configured to adjust the voltage between the direct current bus and the protective earthing to a third preset voltage after first preset duration.

Optionally, the impedance detection apparatus is configured to: if it is determined that the impedance of the combiner box is abnormal, adjust a maximum power point tracking (MPPT) voltage corresponding to the photovoltaic string in the combiner box; sample the MPPT voltage at each of a third time point and a fourth time point, to obtain a first MPPT voltage value and a second MPPT voltage value; and sample the voltage between the direct current bus and the protective earthing at each of the third time point and the fourth time point, to obtain a third voltage value and a fourth voltage value; and calculate an insulation impedance value of the MPPT voltage based on the first MPPT voltage value, the second MPPT voltage value, the third voltage value, and the fourth voltage value, to determine whether impedance of the photovoltaic string is abnormal.

Optionally, the impedance detection apparatus is configured to adjust the MPPT voltage to a fourth preset voltage before the first MPPT voltage and the third voltage value are obtained.

Optionally, the impedance detection apparatus is configured to adjust the MPPT voltage to a fifth preset voltage after second preset duration.

Optionally, the power supply unit includes at least one of a relay, a resistor, a diode, or a direct current power supply.

In FIG. 5, $I_{bus1+}$ is a current on a positive direct current bus BUS+, $I_{bus1-}$ is a current on a negative direct current bus BUS−, and $I_{DCI}$ is an output current of the power supply unit; $MPPT_1$, $MPPT_2$, ..., and $MPPT_N$ respectively represent MPPT voltages corresponding to the N photovoltaic strings; $R_{po1}$ represents an insulation impedance value of a first MPPT positive voltage to the ground, and $R_{ne1}$ represents an insulation impedance value of a first MPPT negative voltage to the ground; $R_{po2}$ represents an insulation impedance value of a second MPPT positive voltage to the ground, and $R_{ne2}$ represents an insulation impedance value of a second MPPT negative voltage to the ground; and by analogy, $R_{poN}$ represents an insulation impedance value of an $N^{th}$ MPPT positive voltage to the ground, and $R_{neN}$ represents an insulation impedance value of an $N^{th}$ MPPT negative voltage to the ground.

In this embodiment, the current sensor can sense information about a detected current, for example, $I_{bus1+}$ and $I_{bus1-}$, and can convert, for output, detected current information into an electrical signal or another form of information that meets a standard.

A leakage current sensor can detect, in real time, signals output by branch sensors. When an insulation status of branches is normal, currents flowing through the leakage current sensor are the same, and are opposite in direction, and an output signal of the leakage current sensor is zero. When a branch is grounded, a differential current flows through the leakage current sensor, and an output signal of the leakage current sensor is not zero.

For example, $I_{bus1+}$ and $I_{bus1-}$ may be sampled by using a discrete device, and $I_{bus1+}$ and $I_{bus1-}$ are subtracted to obtain the leakage current $I_{rcd}$.

For example, a precision resistor may be connected in series to a current loop and a sampling current value may be calculated based on a voltage difference obtained through conversion at two ends of the resistor.

In an optional embodiment, the power supply unit 404 includes at least one of a relay, a resistor, a diode, or a direct current power supply.

In this embodiment, the relay K is an output relay, is an automatic switch that controls operation of a high current by using a low current, and is used for automatic adjustment, safety protection, circuit conversion, and the like in a circuit. In this embodiment, the relay K may be turned off, so that the power supply unit is in the off state, or the relay K may be turned on, so that the power supply unit is in the working state.

In this embodiment, the resistor $R_0$ is an output resistor, and is a Thevenin equivalent resistor viewed from an output end of an amplifier. The amplifier may be equivalent to a signal source having the internal resistor $R_0$.

The direct current power supply is an adjustable direct current power supply. One end is connected to the ground through a resistor, and the other end is connected to the positive direct current bus BUS+ or the negative direct current bus BUS−, to provide a stable current to a load. For example, the adjustable direct current power supply may be a flyback power supply or a forward power supply. This is not limited in this embodiment.

Figure 6:
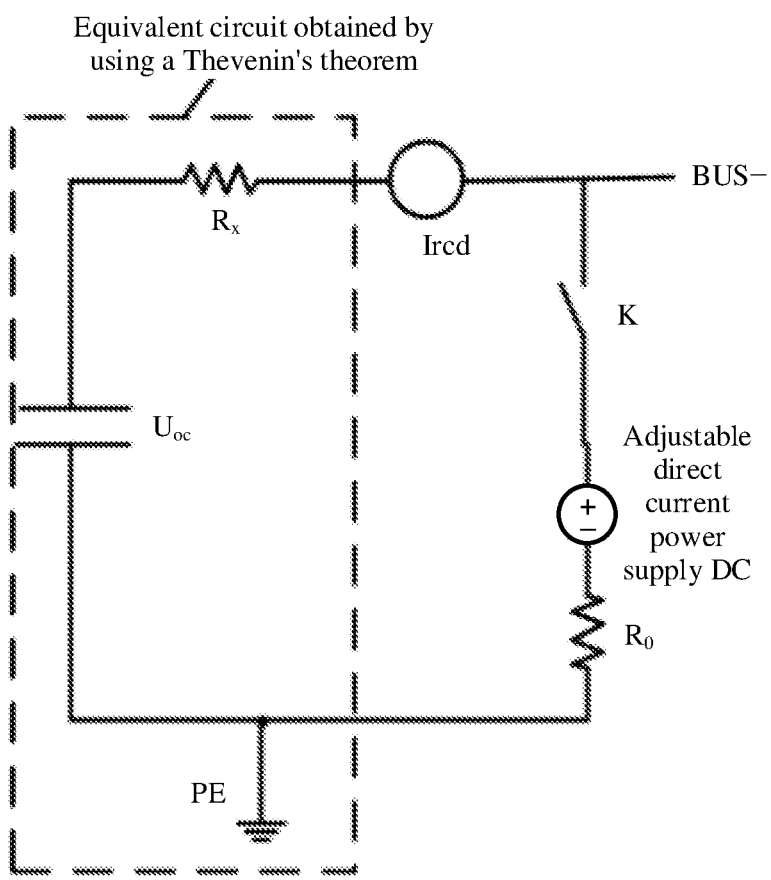
FIG. 6 is a schematic diagram of a Thevenin equivalent circuit of a combiner box according to an embodiment.

According to Thevenin's theorem, the combiner box may be viewed from the negative direct current bus BUS− and the protective earthing PE (BUS−/PE), to obtain a Thevenin equivalent circuit of the combiner box shown in FIG. 6. An internal circuit may be equivalent to a voltage source $U_{oc}$ and a resistor $R_x$ connected in series. The resistor $R_x$ is equivalent to a resistance value $R_{pv}$ (such as the insulation impedance value of the combiner box to the ground) of a photovoltaic panel side of the combiner box to the ground and resistance $R_s$ of an inverter system to the ground that are connected in parallel, and $I_{rcd}$ is a sampling current of the sensor detection unit.

Further, when the M combiner boxes are connected in parallel, a multi-machine parallel Thevenin equivalent circuit shown in FIG. 7 may be obtained by using the Thevenin's theorem.

In FIG. 7, $U_{oc}$ is an equivalent voltage source of an internal circuit, $R_{x1}$, $R_{x2}$, ..., and $R_{xM}$ respectively represent equivalent resistance of a first combiner box, a second combiner box, ..., and an $M^{th}$ combiner box, $I_{r1}$, $I_{r2}$, ..., and $I_{rM}$ respectively represent leakage currents in the first combiner box, the second combiner box, ..., and the $M^{th}$ combiner box, $DC_1$, $DC_2$, ..., and $DC_M$ respectively represent adjustable direct current power supplies in the first combiner box, the second combiner box, ..., and the $M^{th}$ combiner box, K represents an output relay, and $R_0$ represents an output resistor.

In this embodiment, the insulation impedance of the combiner box is analyzed based on the Thevenin equivalent circuit shown in FIG. 6. The BUS−/PE voltage is changed by using the power supply unit, and insulation impedance of equivalent impedance of each combiner box to the ground may be calculated based on a change of the BUS−/PE voltage and a change of the RCD leakage current sensor in the combiner box, to determine whether the insulation impedance of the combiner box is abnormal. An impedance detection method is described below in detail with reference to FIG. 8, FIG. 9, and FIG. 10.

It should be understood that the steps and/or procedures of the impedance detection method in the embodiments may be performed by an impedance detection apparatus. The impedance detection apparatus may be integrated into the photovoltaic system or may be used as an independent device to perform the steps and/or procedures of the impedance detection method through a detection interface. This is not limited.

For example, FIG. 8 is a schematic flowchart of an impedance detection method 800 according to an embodiment. The method 800 includes the following steps.

S801: Sample a voltage between a direct current bus and a protective earthing at each of a first time point and a second time point, to obtain a first voltage value and a second voltage value.

In this embodiment, sampling may be performed by using a sensor detection unit in an impedance detection apparatus. The sensor detection unit may be a differential resistor, and a BUS−/PE voltage of a combiner box may be sampled by using the differential resistor, to obtain the first voltage value $U_1$ and the second voltage value $U_2$.

For example, a BUS−/PE voltage of a combiner box may alternatively be sampled by using a voltage sensor, to obtain the first voltage value $U_1$ and the second voltage value $U_2$.

S802: Sample a leakage current on the direct current bus at each of the first time point and the second time point, to obtain a first current value and a second current value.

In this embodiment, the leakage current on the direct current bus may be sampled by using an RCD leakage current sensor, to obtain the first current value $I_{rcd1}$ and the second current value $I_{rcd2}$.

S803: Calculate an insulation impedance value of the combiner box based on a difference between the first voltage value and the second voltage value and a difference between the first current value and the second current value, to determine whether impedance of the combiner box is abnormal.

In this embodiment, $I_{rcd1}$ and $I_{rcd2}$ may be expressed as follows:

$$I_{rcd1}=(U_{oc}-U_1)/R_x$$

$$I_{rcd2}=(U_{oc}-U_2)/R_x$$

Equivalent impedance $R_x$ may be obtained through solving by combining the two formulas, and is expressed as follows:

$$R_x=(U_1-U_2)/(I_{rcd1}-I_{rcd2})$$

Further, the insulation impedance value $R_{pv}$ of the combiner box to the ground may be obtained based on the equivalent resistance $R_x$ and resistance $R_s$ of an inverter system to the ground, and is expressed as follows:

$$R_{pv}=(R_x \times R_s)/(R_s-x)$$

An insulation impedance standard of a normal inverter is not less than Upv_max/(30 mA). Therefore, when $R_{pv}$<Upv_max/(30 mA), a low insulation impedance alarm may be reported.

It should be understood that Upv_max is a maximum voltage value of an inverter grid-connected power generation system. There may be two voltage levels based on different systems. For example, a value of Upv_max may be 1500 V or 1100 V.

It should be understood that $U_1$ is not equal to $U_2$, $I_{rcd1}$ is not equal to $I_{rcd2}$, and $U_1$ and $U_2$ are limited by Upv_max. Based on different systems, $U_1$ is less than 1100 V or 1500 V, and similarly, $U_2$ is less than 1100 V or 1500 V.

In this embodiment, two different voltage values and two different current values are obtained through sampling by using the sensor detection unit, and it may be determined, based on a change of the voltage value and a change of the current value, whether the insulation impedance of the combiner box to the ground is abnormal. This helps reduce complexity of an operation and reduce costs.

Two different types of logic are provided in this embodiment to implement S801 and S802. Detailed descriptions are provided below with reference to FIG. 9 and FIG. 10.

Figure 9:
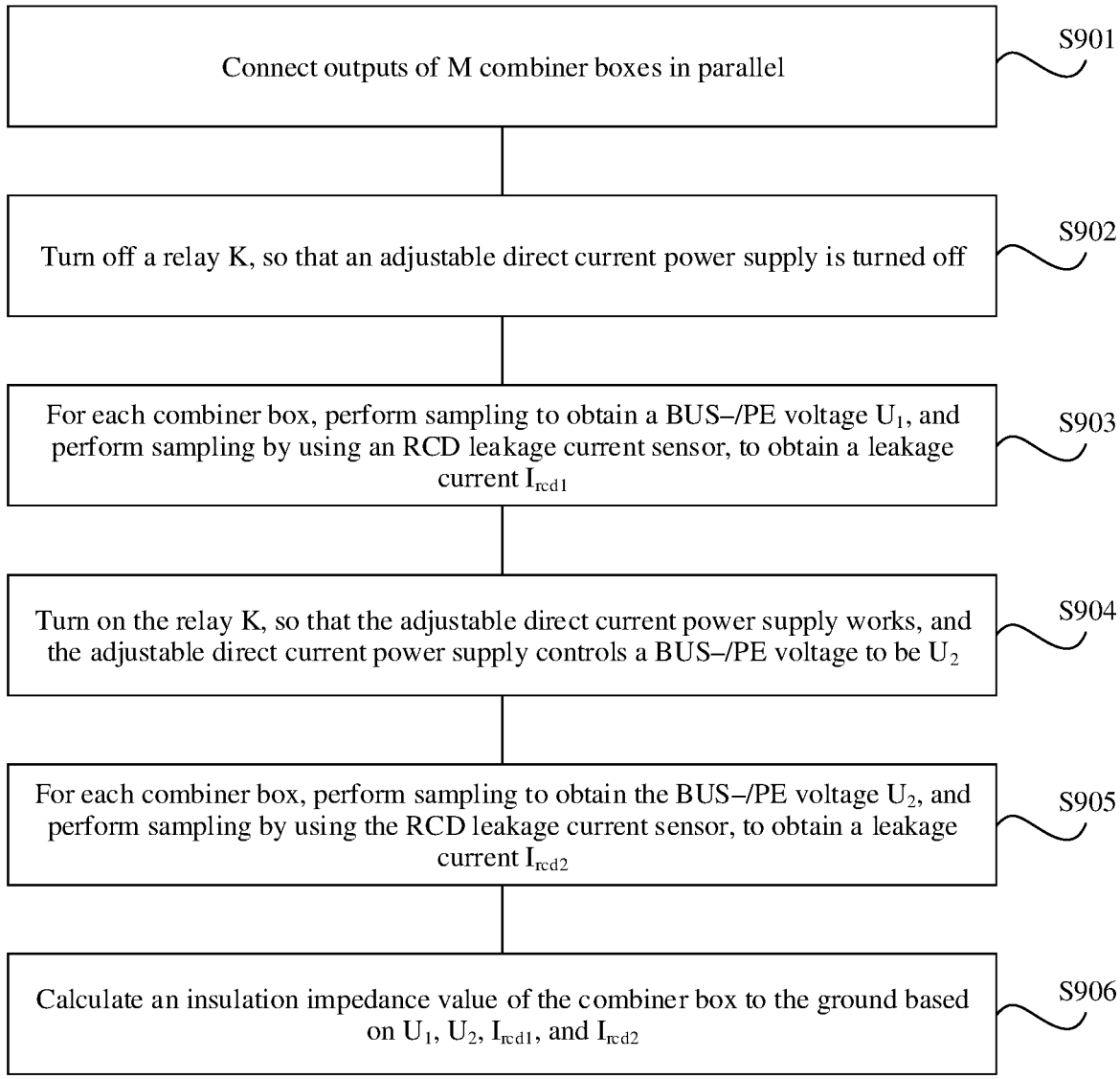
FIG. 9 is a schematic flowchart of another impedance detection method according to an embodiment.

For example, FIG. 9 is a schematic flowchart of another impedance detection method 900 according to an embodiment. In the method 900, a power supply unit is in an off state at a first time point, and the power supply unit is in a working state at a second time point. It should be understood that in this embodiment, the power supply unit is an adjustable direct current power supply, and a relay K is an output relay. The method 900 includes the following steps.

S901: Connect outputs of M combiner boxes in parallel.

S902: Turn off the relay K, so that the adjustable direct current power supply is turned off.

In this embodiment, the DC output relay K is not turned on, so that the power supply of the combiner box is in the off state at the first time point.

S903: For each combiner box, perform sampling to obtain a BUS−/PE voltage $U_1$, and perform sampling by using an RCD leakage current sensor, to obtain a leakage current $I_{rcd1}$.

In this embodiment, at the first time point, for each combiner box, sampling is performed based on a differential resistor, to obtain the BUS−/PE voltage $U_1$, and sampling is performed by using the RCD leakage current sensor, to obtain the direct current leakage current $I_{rcd1}$.

S904: Turn on the relay K, so that the adjustable direct current power supply works, and the adjustable direct current power supply controls a BUS−/PE voltage to be $U_2$.

S905: For each combiner box, perform sampling to obtain the BUS−/PE voltage $U_2$, and perform sampling by using the RCD leakage current sensor, to obtain a leakage current $I_{rcd2}$.

In this embodiment, before a second voltage value and a second current value are obtained, the power supply unit is turned on, so that the power supply unit is in the working state; and the voltage between a direct current bus and a protective earthing is adjusted to a first preset voltage by using the power supply unit.

In this embodiment, the DC output relay K is turned on, the BUS−/PE voltage is first controlled to be the first preset voltage by using the adjustable direct current power supply, and after the first preset voltage is stable, the first preset voltage is sampled to obtain $U_2$.

In this embodiment, the BUS−/PE voltage and a leakage current are sampled at the second time point, to obtain $U_2$ and $I_{rcd2}$. The adjustable direct current power supply is in the working state at the second time point.

It should be understood that the first preset voltage is $U_2$, the second voltage value is $U_2$ obtained through sampling, and the second current value is $I_{rcd2}$ obtained through sampling.

S906: Calculate an insulation impedance value of the combiner box to the ground PE based on $U_1$, $U_2$, $I_{rcd1}$, and $I_{rcd2}$.

A calculation manner in this embodiment is described in S703. Details are not described herein.

In this embodiment, the BUS-/PE voltage may be sampled once before an inverter is grid-connected, and then the BUS-/PE voltage may be sampled once again in a grid-connected working process of the inverter, to determine whether there is impedance abnormality. In this way, power can be saved, and whether the impedance of the combiner box is abnormal can be detected in a timely manner.

In the method 800, sampling is separately performed when an adjustable direct current power supply is in an off state and the adjustable direct current power supply is in a working state, to obtain $U_1$, $U_2$, $I_{rcd1}$, and $I_{rcd2}$. Another type of logic for implementing S801 and S802 is described below in detail with reference to FIG. 10.

Figure 10:
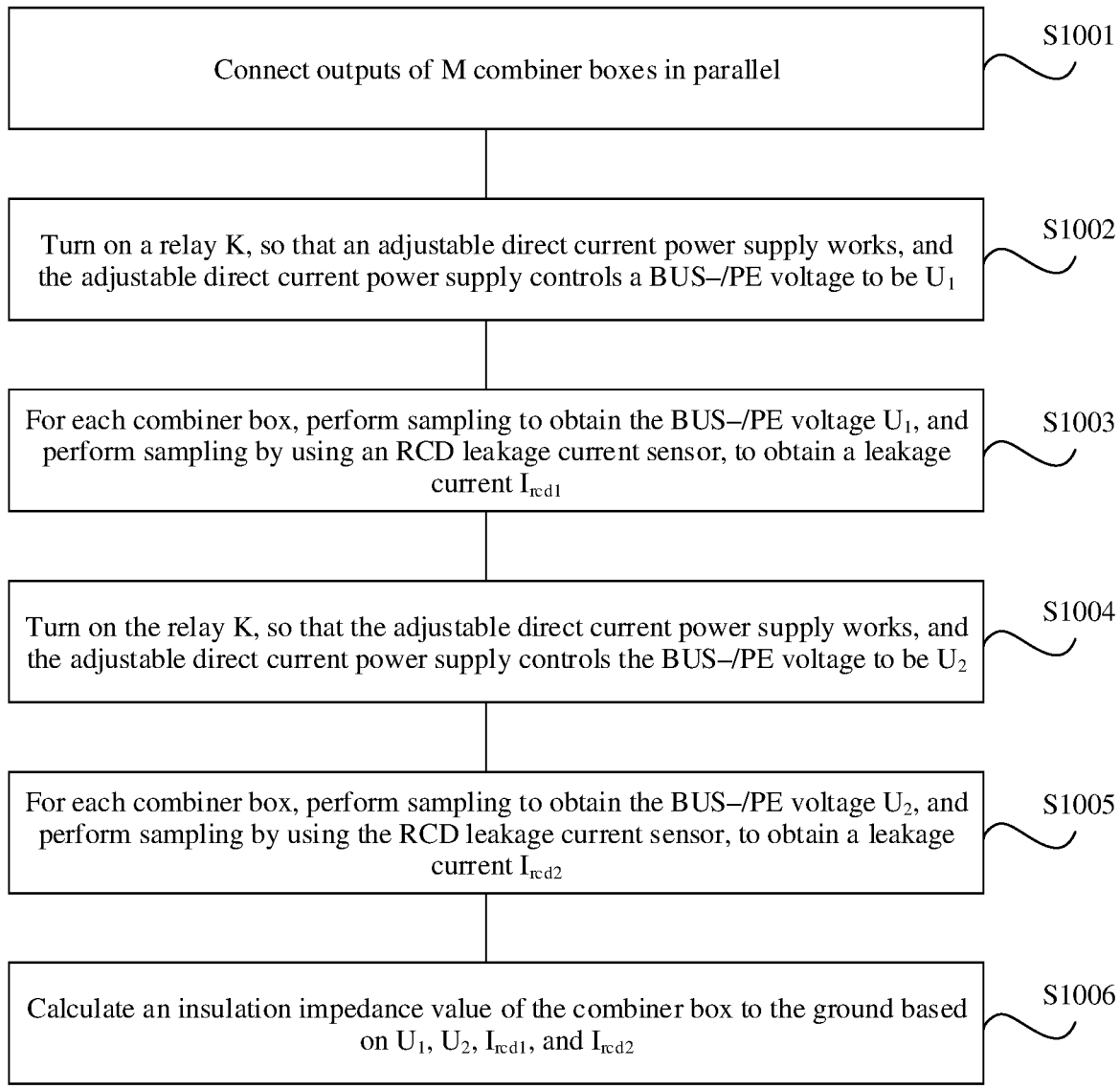
FIG. 10 is a schematic flowchart of another impedance detection method according to an embodiment.

For example, FIG. 10 is a schematic flowchart of still another impedance detection method 1000 according to an embodiment. In the method 1000, a power supply unit is in a working state at both a first time point and a second time point. It should be understood that in this embodiment, the power supply unit is an adjustable direct current power supply, and a relay K is an output relay. The method 1000 includes the following steps.

S1001: Connect outputs of M combiner boxes in parallel.

S1002: Turn on the relay K, so that the adjustable direct current power supply works, and the adjustable direct current power supply controls a BUS-/PE voltage to be $U_1$.

In this embodiment, before a first voltage value and a first current value are obtained, the power supply unit is turned on, so that the power supply unit is in the working state; and the voltage between a direct current bus and a protective earthing is adjusted to a second preset voltage by using the power supply unit.

In this embodiment, the DC output relay K is turned on, the BUS-/PE voltage is first controlled to be the second preset voltage by using the adjustable direct current power supply, and after the second preset voltage is stable, the second preset voltage is sampled at the first time point to obtain $U_1$.

S1003: For each combiner box, perform sampling to obtain the BUS-/PE voltage $U_1$, and perform sampling by using an RCD leakage current sensor, to obtain a leakage current $I_{rcd1}$.

It should be understood that in this embodiment, the second preset voltage is $U_1$, the first voltage value is $U_1$ obtained through sampling, and the first current value is $I_{rcd1}$ obtained through sampling.

S1004: Turn on the relay K, so that the adjustable direct current power supply works, and the adjustable direct current power supply controls the BUS-/PE voltage to be $U_2$.

In this embodiment, before a second voltage value and a second current value are obtained, the voltage between the direct current bus and the protective earthing is adjusted to a third preset voltage by using the power supply unit after first preset duration.

In this embodiment, the DC output relay K is turned on, the BUS-/PE voltage is first controlled to be the third preset voltage by using the adjustable direct current power supply, and after the third preset voltage is stable, the third preset voltage is sampled at the second time point to obtain $U_2$.

After controlling the BUS-/PE voltage to be $U_1$ for the first time, the adjustable direct current power supply may adjust the BUS-/PE voltage for the second time after the first preset duration. The first preset duration may be 5 s, 10 s, or any other duration. This is not limited in this embodiment.

For example, in a process of adjusting the BUS-/PE voltage from $U_1$ to $U_2$, a voltage change may be gradually controlled to adjust the voltage to $U_2$, or the voltage may be directly adjusted to $U_2$. This is not limited.

S1005: For each combiner box, perform sampling to obtain the BUS-/PE voltage $U_2$, and perform sampling by using the RCD leakage current sensor, to obtain a leakage current $I_{rcd2}$.

It should be understood that in this embodiment, the third preset voltage is $U_2$, the second voltage value is $U_2$ obtained through sampling, and the second current value is $I_{rcd2}$ obtained through sampling.

S1006: Calculate an insulation impedance value of the combiner box to the ground PE based on $U_1$, $U_2$, $I_{rcd1}$, and $I_{rcd2}$.

In this embodiment, the BUS-/PE voltage may be sampled twice online in a grid-connected running process of the inverter, to determine whether there is impedance abnormality. In this way, two different voltage values can be obtained by adjusting only the BUS-/PE voltage. An operation is simple, and an abnormal combiner box can be more effectively located.

It should be understood that a plurality of combiner boxes may be detected in parallel by using the method for detecting insulation impedance of a combiner box described above. This helps improve detection efficiency.

The method for detecting abnormal insulation impedance of a combiner box to the ground is described above in detail with reference to FIG. 8 to FIG. 10. In an actual detection process, the combiner box is connected to a plurality of photovoltaic strings. Therefore, in the embodiments, a photovoltaic string that has low insulation impedance to the ground in the abnormal combiner box may be further accurately detected. A method for detecting abnormality in a photovoltaic string is described below in detail with reference to FIG. 11.

For example, FIG. 11 is a schematic flowchart of yet another impedance detection method 1100 according to an embodiment. The method 1100 includes the following steps.

S801: Sample a voltage between a direct current bus and a protective earthing at each of a first time point and a second time point, to obtain a first voltage value and a second voltage value.

S802: Sample a leakage current on the direct current bus at each of the first time point and the second time point, to obtain a first current value and a second current value.

S803: Calculate an insulation impedance value of a combiner box based on a difference between the first voltage value and the second voltage value and a difference between the first current value and the second current value, to determine whether impedance of the combiner box is abnormal.

S1110: If it is determined that the impedance of the combiner box is abnormal, adjust a maximum power point tracking (MPPT) voltage corresponding to a photovoltaic string in the combiner box.

S1120: Sample the MPPT voltage at each of a third time point and a fourth time point, to obtain a first MPPT voltage value and a second MPPT voltage value.

It should be understood that an adjustable direct current power supply is in a working state at both the third time point and the fourth time point.

S1130: Sample the voltage between the direct current bus and the protective earthing at each of the third time point and the fourth time point, to obtain a third voltage value and a fourth voltage value.

S1140: Calculate an insulation impedance value of the MPPT voltage based on the first MPPT voltage value, the second MPPT voltage value, the third voltage value, and the fourth voltage value, to determine whether impedance of the photovoltaic string is abnormal.

In this embodiment, the MPPT voltage is adjusted, and insulation impedance values $R_{po}$ and $R_{ne}$ of an MPPT voltage of each photovoltaic string to the ground may be calculated based on two different MPPT voltage values obtained through sampling. Herein, $R_{po}$ is an insulation impedance value of a positive electrode of the input end of the DC-DC boost unit to the ground, and $R_{ne}$ is an insulation impedance value of a negative electrode of the MPPT voltage to the ground. Therefore, a photovoltaic string corresponding to an MPPT voltage with low insulation impedance can be detected. In this way, an operation is simple, a detection result is efficient and accurate, and it is easy to implement.

In an optional embodiment, before the first MPPT voltage value and the third voltage value are obtained, the MPPT voltage is adjusted to a fourth preset voltage by using a DC-DC boost unit.

In an optional embodiment, before the second MPPT voltage value and the fourth voltage value are obtained, the MPPT voltage may be adjusted to a fifth preset voltage by using the DC-DC boost unit after second preset duration.

In this embodiment, for a combiner box with an insulation impedance problem, changes of all MPPT voltages may be sequentially controlled by using an internal DC-DC boost unit, to calculate insulation impedance $R_{po}$ and $R_{ne}$ of a positive electrode and a negative electrode of each input end of the DC-DC boost unit to the ground. This helps accurately locate a photovoltaic string with abnormal insulation impedance in a scenario in which combiner boxes are connected in parallel and ensures that grid connection is normally performed.

Calculation of the insulation impedance value of the MPPT voltage to the ground is analyzed by using a first photovoltaic string as an example. An MPPT voltage corresponding to the photovoltaic string is first controlled to be the fourth preset voltage $U_{pv11}$ by using the DC-DC boost unit, to obtain that the BUS−/PE voltage is $U_{11}$, then the MPPT voltage is controlled to be the fifth preset voltage $U_{pv12}$, to obtain that the BUS−/PE voltage is $U_{12}$, and then insulation impedance $R_{po1}$ and $R_{ne1}$ of the MPPT voltage corresponding to the single photovoltaic string to the ground PE may be obtained through solving based on the following equation set:

$$U_{11}=(U_{pv11} \times R_{ne1})/(R_{po1}+R_{ne1})$$

$$U_{12}=(U_{pv12} \times R_{ne1})/(R_{po1}+R_{ne1})$$

In the formulas, $U_{11}$, $U_{12}$, $U_{pv11}$, and $U_{pv12}$ are known. Therefore, $R_{po1}$ and $R_{ne1}$ can be obtained through solving. Negative electrodes of a plurality of MPPTs are connected in parallel, and therefore a MPPT voltage whose negative electrode has abnormal insulation impedance to the ground cannot be determined. However, positive electrodes of the MPPTs can be distinguished. Therefore, when $R_{po1}$ is less than a safety threshold, it may be determined that insulation impedance of the first photovoltaic string is abnormal. For example, the safety threshold may be 50 KΩ.

It should be understood that for a combiner box with abnormal insulation impedance, insulation impedance values of MPPT voltages corresponding to other photovoltaic strings to the ground are sequentially detected. A detection method is the same as the foregoing method. Details are not described herein.

Optionally, after S1140, if it is determined that there is a combiner box with abnormal insulation impedance in a photovoltaic system, an instruction is sent to a monitoring board in an inverter, where the instruction is used to indicate that the combiner box has low insulation impedance, a control trip of an input direct current switch of the combiner box with low insulation impedance is turned off, and another combiner box with normal insulation impedance may be put into grid connection. In addition, a background person may receive a low insulation impedance alarm through an application (APP) and rectify a fault in a timely manner.

In FIG. 4A, FIG. 4B, FIG. 4C, and FIG. 5, the impedance detection apparatus is connected to the direct current bus, and an output end of the power supply unit 404 is connected to the negative direct current bus. However, it should be understood that connection positions of the sensor detection unit 403 and the power supply unit 404 in a circuit may be changed. Five different circuit topology change forms of the photovoltaic system are described below by still using the combiner box 1 as an example and with reference to FIG. 12 to FIG. 16.

In photovoltaic systems 1200, 1300, 1400, 1500, and 1600, for example, the combiner box 1 includes N direct current switches, N DC-DC boost units, an impedance detection apparatus, and a power supply unit.

It should be understood that although a circuit structure changes, the impedance detection methods 800, 900, 1000, and 1100 in the embodiments may still be applied to any one of the photovoltaic systems 1200, 1300, 1400, 1500, and 1600. This is not limited.

Figure 12:
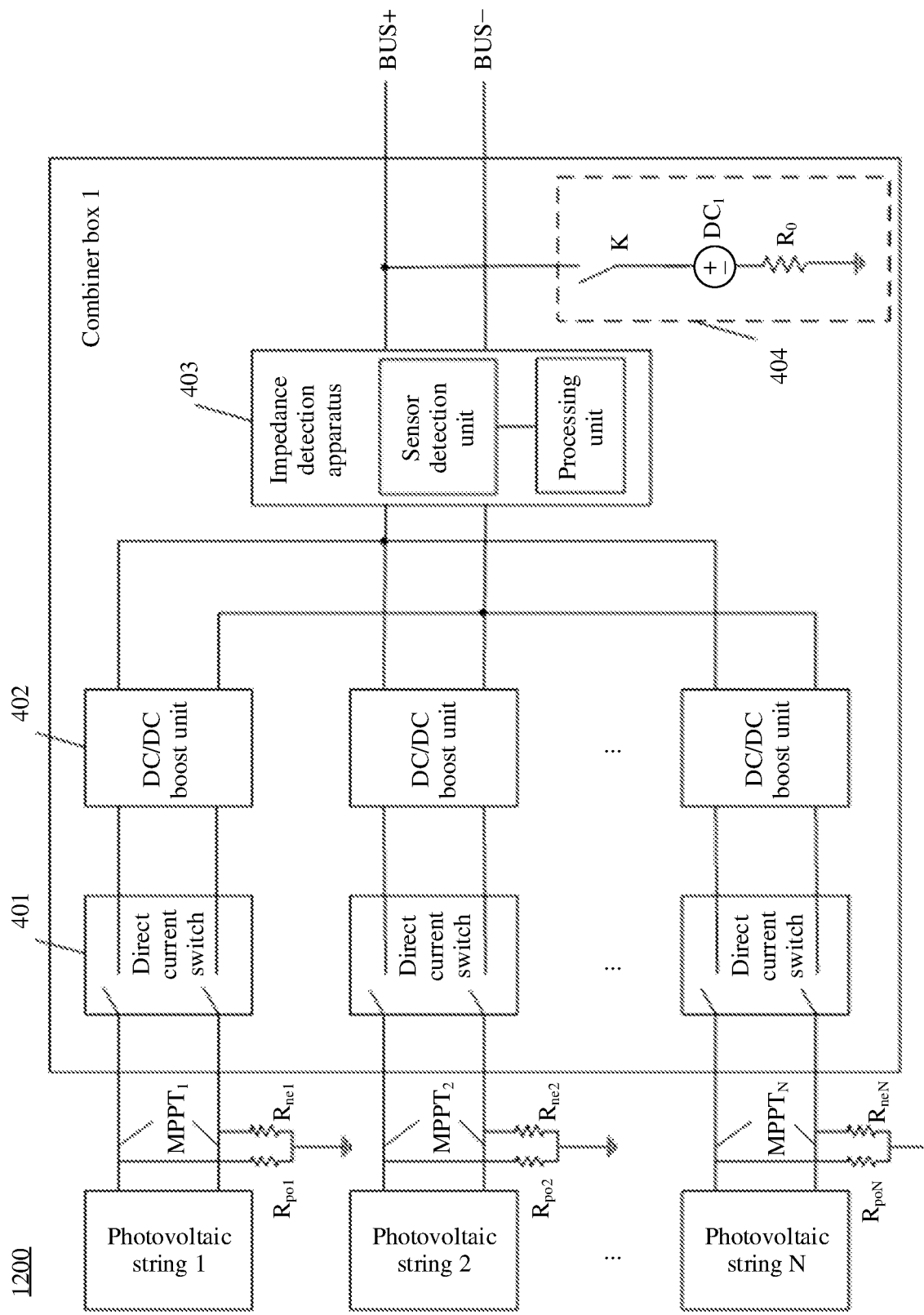
FIG. 12 is a circuit topology diagram of yet another photovoltaic system according to an embodiment.

As shown in FIG. 12, in the photovoltaic system 1200, an input end of the direct current switch is connected to a photovoltaic string, an output end of the direct current switch is connected to an input end of the DC-DC boost unit, an output end of the DC-DC boost unit is connected to an input end of the impedance detection apparatus, and an output end of the impedance detection apparatus is connected to a direct current bus and is located inside the power supply unit.

Different from a case in which the power supply unit in the photovoltaic system 500 is connected to the negative direct current bus BUS−, the power supply unit in the photovoltaic system 1200 is connected to a positive direct current bus BUS+.

Figure 13:
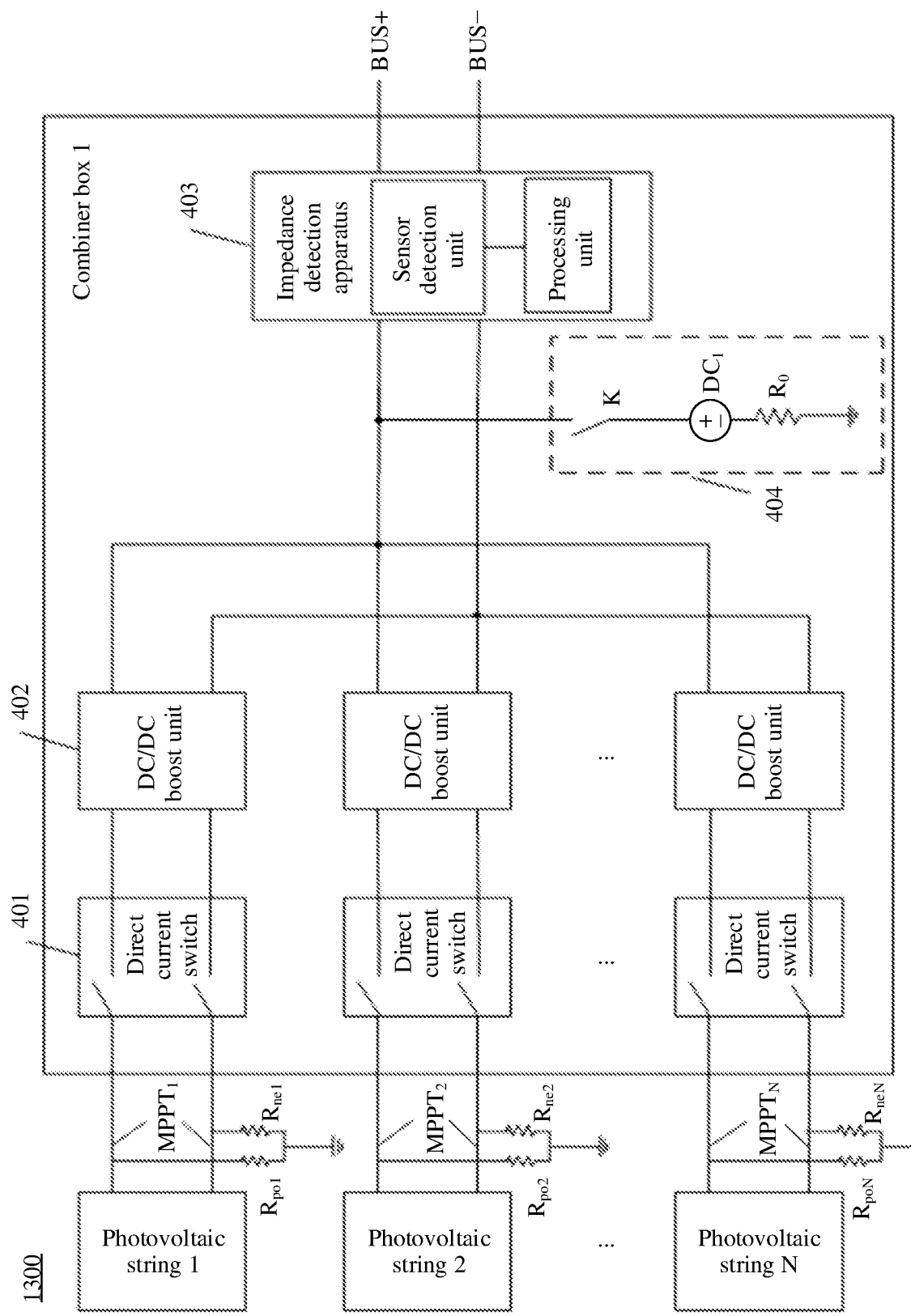
FIG. 13 is a circuit topology diagram of yet another photovoltaic system according to an embodiment.

As shown in FIG. 13, in the photovoltaic system 1300, an input end of the direct current switch is connected to a photovoltaic string, an output end of the direct current switch is connected to an input end of the DC-DC boost unit, and an output end of the DC-DC boost unit is connected to a direct current bus.

Different from a case in which the power supply unit in the photovoltaic system 500 is connected to the negative direct current bus BUS−, and the impedance detection apparatus is connected to a direct current bus inside the power supply unit, the power supply unit in the photovoltaic system 1300 is connected to a positive direct current bus BUS+, and the impedance detection apparatus is connected to a direct current bus outside the power supply unit.

Figure 14:
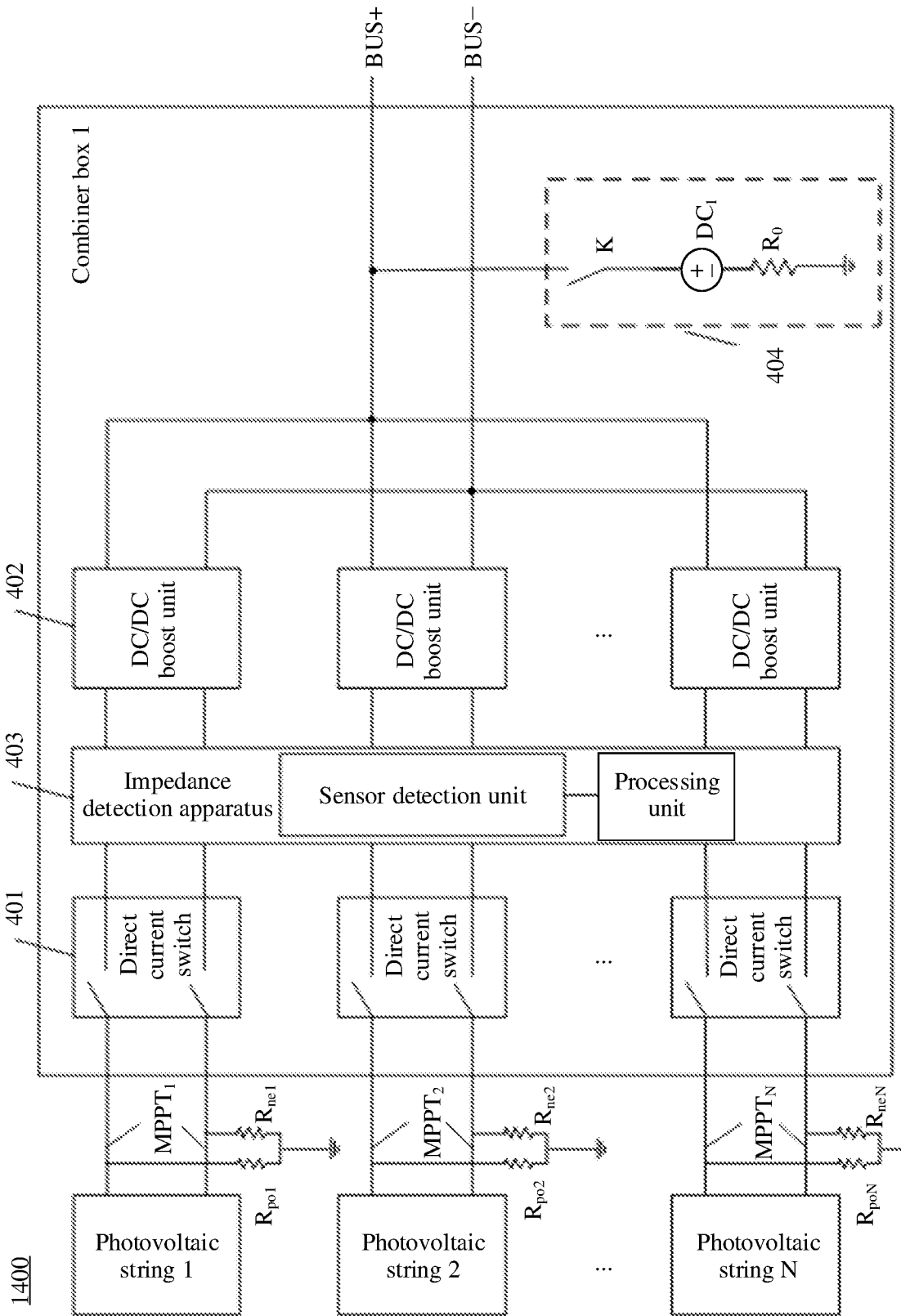
FIG. 14 is a circuit topology diagram of yet another photovoltaic system according to an embodiment.

As shown in FIG. 14, in the photovoltaic system 1400, an input end of the direct current switch is connected to a photovoltaic string, an output end of the direct current switch is connected to an input end of the impedance detection apparatus, an output end of the impedance detection apparatus is connected to an input end of the DC-DC boost unit, and an output end of the DC-DC boost unit is connected to a direct current bus.

Different from a case in which the power supply unit in the photovoltaic system 500 is connected to the negative direct current bus BUS−, and the impedance detection apparatus is connected to a direct current bus inside the power supply unit, the power supply unit in the photovoltaic system 1400 is connected to a positive direct current bus BUS+, and the impedance detection apparatus is connected between the direct current switch and the DC-DC boost unit.

Figure 15:
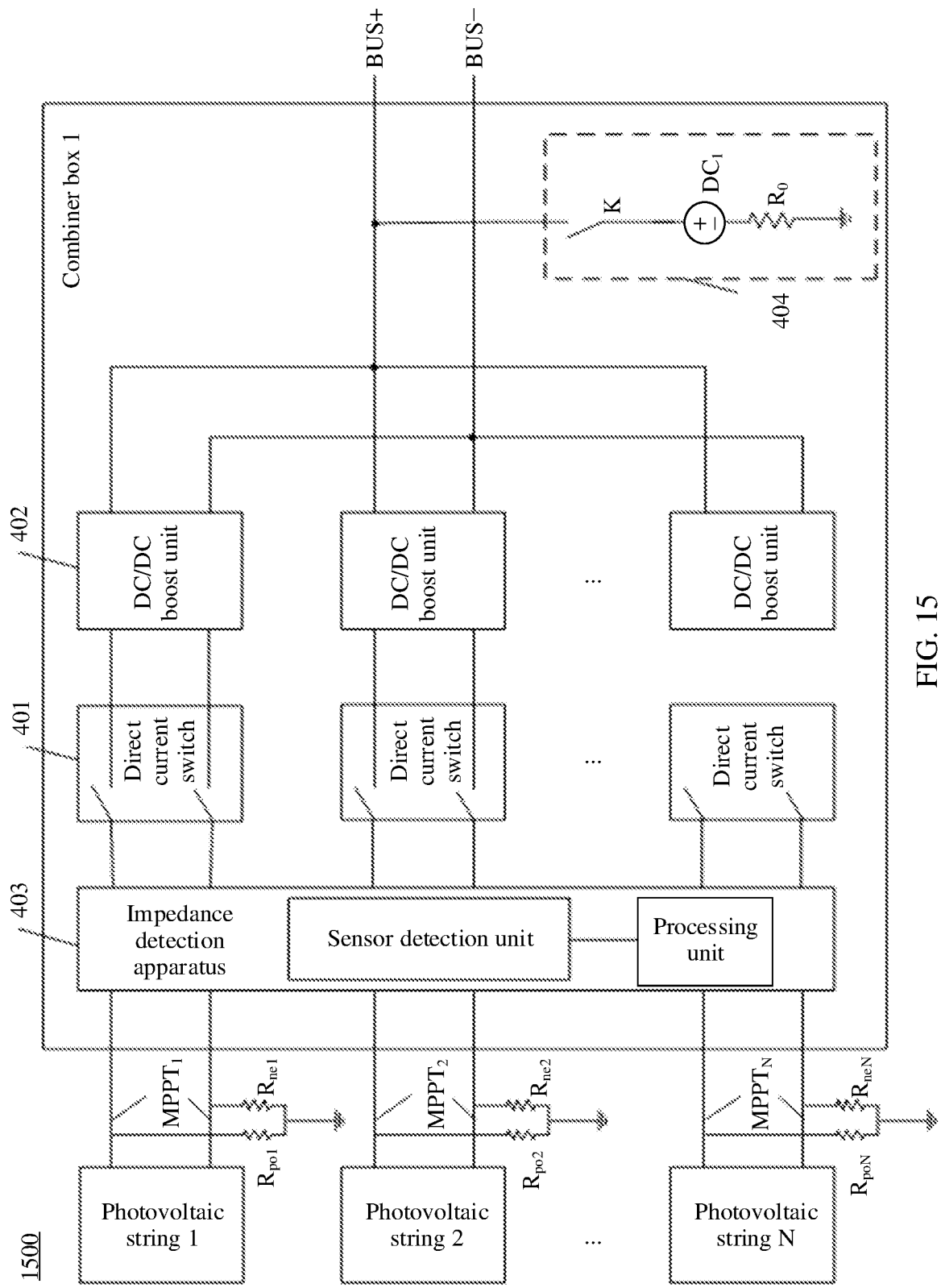
FIG. 15 is a circuit topology diagram of yet another photovoltaic system according to an embodiment.

As shown in FIG. 15, in the photovoltaic system 1500, an input end of the impedance detection apparatus is connected to a photovoltaic string, an output end of the impedance detection apparatus is connected to an input end of the direct current switch, an output end of the direct current switch is connected to an input end of the DC-DC boost unit, and an output end of the DC-DC boost unit is connected to a direct current bus.

Different from a case in which the power supply unit in the photovoltaic system 500 is connected to the negative direct current bus BUS−, and the impedance detection apparatus is connected to a direct current bus inside the power supply unit, the power supply unit in the photovoltaic system 500 is connected to a positive direct current bus BUS+, and the impedance detection apparatus is connected before the direct current switch.

Figure 16:
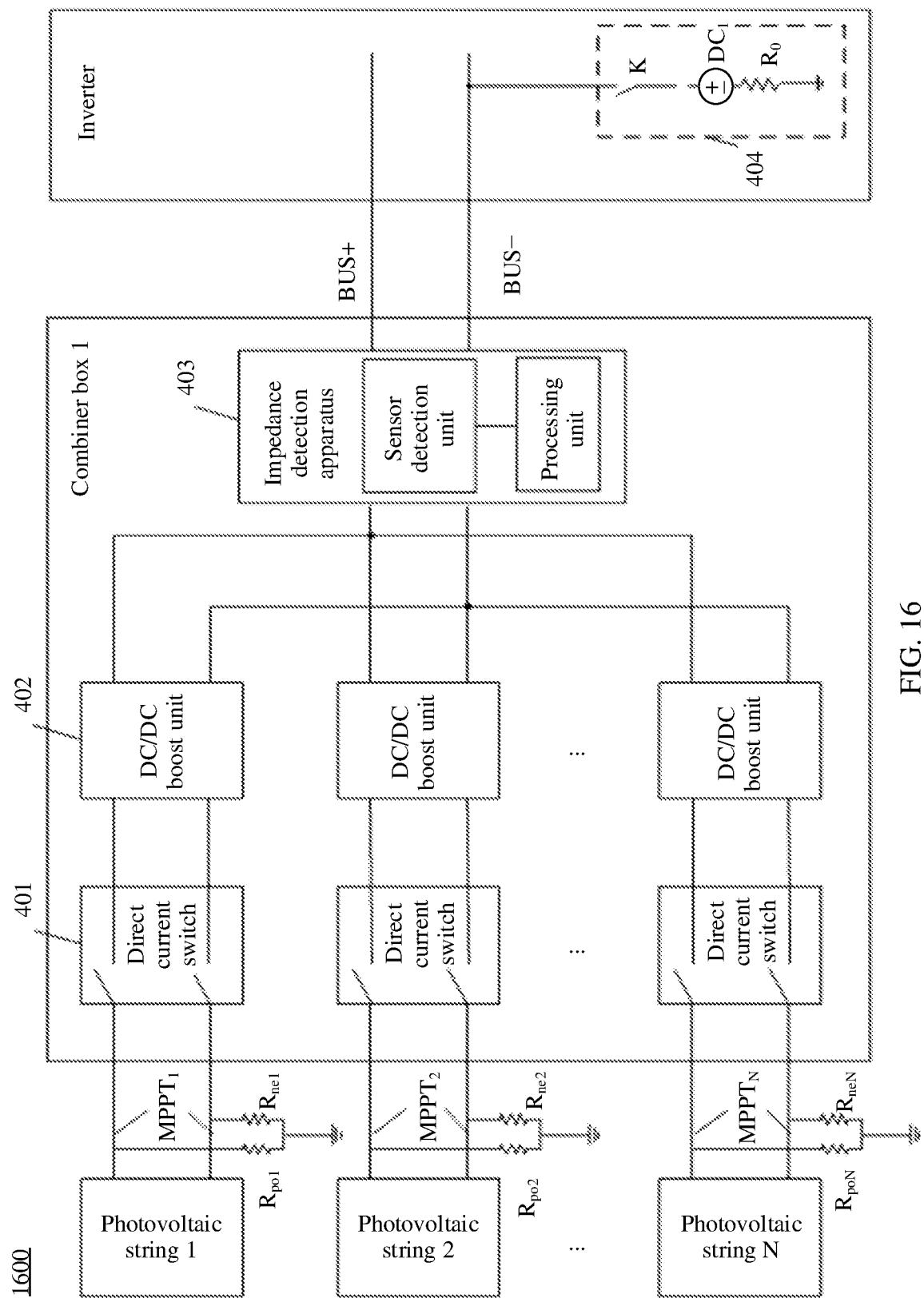
FIG. 16 is a circuit topology diagram of yet another photovoltaic system according to an embodiment.

As shown in FIG. 16, in the photovoltaic system 1600, an input end of the direct current switch is connected to a photovoltaic string, an output end of the direct current switch is connected to an input end of the DC-DC boost unit, an output end of the DC-DC boost unit is connected to an input end of the impedance detection apparatus, and an output end of the impedance detection apparatus is connected to a direct current bus and is located inside the power supply unit.

Different from a case in which the power supply unit in the photovoltaic system 500 is located inside the combiner box and is connected to the negative direct current bus BUS−, the power supply unit in the photovoltaic system 1600 is located inside an inverter and is connected to a negative direct current bus BUS−.

It should be understood that the circuit change manners in the photovoltaic system 500 and the photovoltaic systems 1200 to 1600 may be combined with each other.

Optionally, on the basis of the photovoltaic system 500, the impedance detection apparatus may be connected to the direct current bus outside the power supply unit with reference to a connection manner of the photovoltaic system 1300.

Optionally, on the basis of the photovoltaic system 500, the impedance detection apparatus may be connected between the direct current switch and the DC-DC boost unit with reference to a connection manner of the photovoltaic system 1400.

Optionally, on the basis of the photovoltaic system, the impedance detection apparatus may be connected before the direct current switch with reference to a connection manner of the photovoltaic system.

Optionally, on the basis of the photovoltaic system 1600, the impedance detection apparatus may be connected between the direct current switch and the DC-DC boost unit with reference to a connection manner of the photovoltaic system 1400.

Optionally, on the basis of the photovoltaic system 1600, the impedance detection apparatus may be connected before the direct current switch with reference to a connection manner of the photovoltaic system 1500.

It should be understood that there may be another possible combination manner. This is not limited in this embodiment.

The impedance detection method according to the embodiments is described above in detail with reference to FIG. 8 to FIG. 11. An impedance detection apparatus according to the embodiments is described below in detail with reference to FIG. 17 and FIG. 18.

Figure 17:
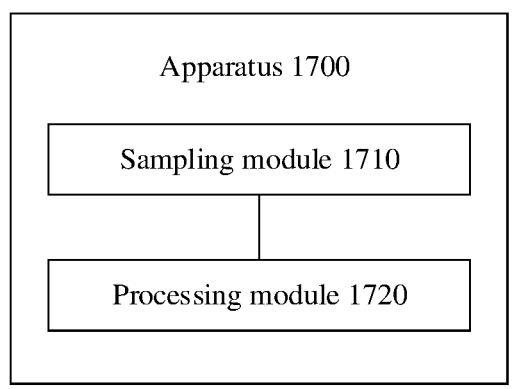
FIG. 17 is a schematic block diagram of an impedance detection apparatus according to an embodiment.

FIG. 17 is a schematic block diagram of an impedance detection apparatus 1700 according to an embodiment. The apparatus 1700 includes a sampling module 1710 and a processing module 1720. The sampling module 1710 is equivalent to the sensor detection unit in the foregoing photovoltaic system, and the processing module 1720 is equivalent to the processing unit in the foregoing photovoltaic system.

The sampling module 1710 is configured to: sample a voltage between a direct current bus and a protective earthing at each of a first time point and a second time point, to obtain a first voltage value and a second voltage value; and sample a leakage current on the direct current bus at each of the first time point and the second time point, to obtain a first current value and a second current value. The processing module 1720 is configured to calculate an insulation impedance value of a combiner box based on a difference between the first voltage value and the second voltage value and a difference between the first current value and the second current value, to determine whether impedance of the combiner box is abnormal.

Optionally, the photovoltaic system further includes a power supply unit, one end of the power supply unit is grounded, the other end of the power supply unit is connected to the direct current bus, the power supply unit is in an off state at the first time point, and the power supply unit is in a working state at the second time point.

Optionally, the processing module 1720 is configured to: turn on the power supply unit before the second voltage value and the second current value are obtained, so that the power supply unit is in the working state; and adjust the voltage between the direct current bus and the protective earthing to a first preset voltage.

Optionally, the photovoltaic system further includes a power supply unit, one end of the power supply unit is grounded, the other end of the power supply unit is connected to the direct current bus, and the power supply unit is in a working state at both the first time point and the second time point.

Optionally, the processing module 1720 is configured to: turn on the power supply unit before the first voltage value and the first current value are obtained, so that the power supply unit is in the working state; and adjust the voltage between the direct current bus and the protective earthing to a second preset voltage.

Optionally, the processing module 1720 is configured to adjust the voltage between the direct current bus and the protective earthing to a third preset voltage after first preset duration.

Optionally, the processing module 1720 is configured to: if it is determined that the impedance of the combiner box is abnormal, adjust a maximum power point tracking (MPPT) voltage corresponding to a photovoltaic string in the combiner box; the sampling module 1710 is configured to sample the MPPT voltage at each of a third time point and a fourth time point, to obtain a first MPPT voltage value and a second MPPT voltage value; the sampling module 1710 is further configured to sample the voltage between the direct current bus and the protective earthing at each of the third time point and the fourth time point, to obtain a third voltage value and a fourth voltage value; and the processing module 1720 is further configured to calculate an insulation impedance value of the MPPT voltage based on the first MPPT voltage value, the second MPPT voltage value, the third voltage value, and the fourth voltage value, to determine whether impedance of the photovoltaic string is abnormal.

Optionally, before the first MPPT voltage and the third voltage value are obtained, the processing module 1720 is configured to adjust the MPPT voltage to a fourth preset voltage.

Optionally, the processing module 1720 is configured to adjust the MPPT voltage to a fifth preset voltage after second preset duration.

Optionally, the power supply unit includes at least one of a relay, a resistor, a diode, or a direct current power supply.

It should be understood that the apparatus 1700 herein is embodied in a form of a functional module. The term "module" herein may be an application-specific integrated circuit (ASIC), an electronic circuit, a processor (for example, a shared processor, a dedicated processor, or a group processor) configured to execute one or more software or firmware programs, a memory, a combinational logic circuit, and/or another appropriate component that supports the described function. In an optional example, a person skilled in the art may understand that the apparatus 1700 may be an electronic device or may be a chip or a chip system in an electronic device, or a function of a chip or a chip system in an electronic device may be integrated into the apparatus 1700, and the apparatus 1700 may be configured to perform the procedures and/or steps of any impedance detection method in the foregoing method embodiments. To avoid repetition, details are not described herein.

The apparatus 1700 has a function for implementing the corresponding steps performed by the impedance detection apparatus in the foregoing method. The function may be implemented by hardware or may be implemented by executing corresponding software by hardware. The hardware or the software includes one or more modules corresponding to the function.

In this embodiment, the apparatus 1700 in FIG. 17 may alternatively be a chip or a chip system, for example, a system on chip (SoC).

Figure 18:
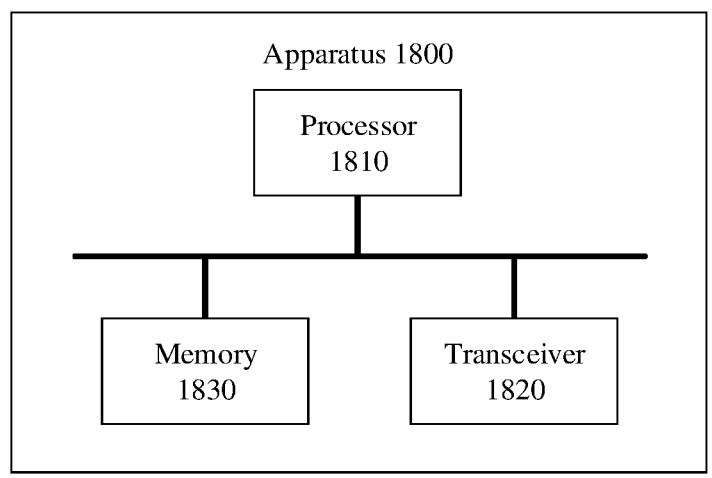
FIG. 18 is a schematic block diagram of another impedance detection apparatus according to an embodiment.

FIG. 18 is a schematic block diagram of another impedance detection apparatus 1800 according to an embodiment. The apparatus 1800 includes a processor 1810, a transceiver 1820, and a memory 1830. The processor 1810, the transceiver 1820, and the memory 1830 communicate with each other by using an internal connection path. The memory 1830 is configured to store instructions. The processor 1810 is configured to execute the instructions stored in the memory 1830, to control the transceiver 1820 to send a signal and/or receive a signal.

It should be understood that the apparatus 1800 may be the impedance detection apparatus in the foregoing embodiment, or a function of the impedance detection apparatus in the foregoing embodiment may be integrated into the apparatus 1800, and the apparatus 1800 may be configured to perform the steps and/or procedures corresponding to the impedance detection apparatus in the foregoing method embodiments. Optionally, the memory 1830 may include a read-only memory and a random access memory and provide instructions and data to the processor. A part of the memory may further include a nonvolatile random access memory. For example, the memory may further store information of a device type. The processor 1810 may be configured to execute the instructions stored in the memory, and when the processor executes the instructions, the processor can perform the steps and/or procedures corresponding to the impedance detection apparatus in the foregoing method embodiments.

It should be understood that in this embodiment, the processor 1810 may be a central processing unit (CPU), or the processor may be another general-purpose processor, a digital signal processor (DSP), an application-specific integrated circuit (ASIC), a field programmable gate array (FPGA) or another programmable logic device, a discrete gate or a transistor logic device, a discrete hardware component, or the like. The general-purpose processor may be a microprocessor, or the processor may be any conventional processor or the like.

In an implementation process, the steps of the foregoing methods may be completed by using an integrated logic circuit of hardware in the processor, or by using instructions in a form of software. The steps of the methods with reference to embodiments may be directly performed and completed by a hardware processor or may be performed and completed by using a combination of hardware in the processor and a software module. The software module may be located in a mature non-transitory storage medium in the art, for example, a random access memory, a flash memory, a read-only memory, a programmable read-only memory, an electrically erasable programmable memory, or a register. The non-transitory storage medium is located in the memory, and the processor executes the instructions in the memory and completes the steps of the foregoing methods in combination with the hardware in the processor. To avoid repetition, details are not described herein.

A person of ordinary skill in the art may be aware that the example modules, algorithms, and steps described with reference to the embodiments can be implemented by electronic hardware or a combination of computer software and electronic hardware. Whether the functions are performed by hardware or software depends on particular applications. A person skilled in the art may use different methods to implement the described functions for each particular application, but it should not be considered that the implementation goes beyond the scope of the embodiments.

It may be clearly understood by a person skilled in the art that for the purpose of convenient and brief description, for a detailed working process of the system, apparatus, and module described above, refer to the corresponding process in the foregoing method embodiments. Details are not described herein.

In the several embodiments, it should be understood that the system, apparatus, and method may be implemented in other manners. For example, the described apparatus embodiment is merely an example. For example, division into the modules is merely logical function division and may be other division in actual implementation. For example, a plurality of modules or components may be combined or integrated into another system, or some features may be ignored or not performed. In addition, the displayed or discussed mutual couplings or direct couplings or communication connections may be implemented by using some interfaces. The indirect couplings or communication connections between the apparatuses or modules may be implemented in electrical, mechanical, or other forms.

The modules described as separate parts may or may not be physically separate, and parts displayed as modules may or may not be physical modules, that is, may be located at one position, or may be distributed on a plurality of network modules. Some or all of the modules may be selected based on actual requirements to achieve the objectives of the solutions of embodiments. In addition, functional modules in embodiments may be integrated into one processing module, each module may exist alone physically, or two or more modules may be integrated into one module.

When the functions are implemented in a form of a software functional module and sold or used as an independent product, the functions may be stored in a non-transitory computer-readable storage medium. Based on such an understanding, the embodiments may be implemented in a form of a software product. The computer software product is stored in a non-transitory storage medium and includes several instructions for instructing a computer device (which may be a personal computer, a server, a network device, or the like) to perform all or some of the steps of the methods described in the embodiments. The non-transitory storage medium includes any medium that can store program code, for example, a USB flash drive, a removable hard disk, a read-only memory (ROM), a random access memory (RAM), a magnetic disk, or an optical disc.

The foregoing descriptions are merely implementations, but the scope of the embodiments is not limited thereto. Any variation or replacement readily figured out by a person skilled in the art shall fall within the scope of the embodiments.

What is claimed is:

1. An impedance detection method, applied to a photovoltaic system, wherein the photovoltaic system comprises a plurality of combiner boxes and an inverter, an input end of each of the plurality of combiner boxes is connected to a photovoltaic string, output ends of the plurality of combiner boxes are connected to the inverter by using a direct current bus, the combiner box comprises at least one direct current switch and at least one DC-DC boost unit, an input end of the direct current switch is connected to the photovoltaic string, an output end of the direct current switch is connected to an input end of the DC-DC boost unit, an output end of the DC-DC boost unit is connected to the direct current bus, and the method comprises:
   sampling a voltage between the direct current bus and a protective earthing at each of a first time point and a second time point, to obtain a first voltage value and a second voltage value;
   sampling a leakage current on the direct current bus at each of the first time point and the second time point, to obtain a first current value and a second current value; and
   calculating an insulation impedance value of the combiner box based on a difference between the first voltage value and the second voltage value and a difference between the first current value and the second current value, to determine whether impedance of the combiner box is abnormal;
   after it is determined that the impedance of the combiner box is abnormal, adjusting a maximum power point tracking (MPPT) voltage corresponding to the photovoltaic string in the combiner box;
   sampling the MPPT voltage at each of a third time point and a fourth time point, to obtain a first MPPT voltage value and a second MPPT voltage value;
   sampling the voltage between the direct current bus and the protective earthing at each of the third time point and the fourth time point, to obtain a third voltage value and a fourth voltage value; and
   calculating an insulation impedance value of the MPPT voltage based on the first MPPT voltage value, the second MPPT voltage value, the third voltage value, and the fourth voltage value, to determine whether impedance of the photovoltaic string is abnormal.

2. The impedance detection method according to claim 1, wherein the photovoltaic system further comprises a power supply unit, one end of the power supply unit is grounded, the other end of the power supply unit is connected to the direct current bus, the power supply unit is in an off state at the first time point, and the power supply unit is in a working state at the second time point.

3. The impedance detection method according to claim 2, wherein before obtaining the second voltage value and obtaining the second current value, the method further comprises:
   turning on the power supply unit, so that the power supply unit is in the working state; and
   adjusting the voltage between the direct current bus and the protective earthing to a first preset voltage by using the power supply unit.

4. The impedance detection method according to claim 1, wherein the photovoltaic system further comprises a power supply unit, one end of the power supply unit is grounded, the other end of the power supply unit is connected to the direct current bus, and the power supply unit is in a working state at both the first time point and the second time point.

5. The impedance detection method according to claim 4, wherein before obtaining the first voltage value and obtaining the first current value, the method further comprises:
   turning on the power supply unit, so that the power supply unit is in the working state; and
   adjusting the voltage between the direct current bus and the protective earthing to a second preset voltage by using the power supply unit.

6. The impedance detection method according to claim 5, wherein before obtaining the second voltage value and obtaining the second current value, the method further comprises:
   adjusting the voltage between the direct current bus and the protective earthing to a third preset voltage by using the power supply unit after first preset duration.

7. The impedance detection method according to, claim 1 wherein before obtaining the first MPPT voltage value and obtaining the third voltage value, the method further comprises:
   adjusting the MPPT voltage to a fourth preset voltage by using the DC-DC boost unit.

8. The impedance detection method according to claim 7, wherein before obtaining the second MPPT voltage value and obtaining the fourth voltage value, the method further comprises:
   adjusting the MPPT voltage to a fifth preset voltage by using the DC-DC boost unit after second preset duration.

9. The impedance detection method according to claim 1, wherein the power supply unit further comprises at least one of a relay, a resistor, a diode, or a direct current power supply.

10. A photovoltaic system, comprising
    a plurality of combiner boxes;
    an inverter;
    an impedance detection apparatus, wherein an input end of each of the plurality of combiner boxes is connected to a photovoltaic string, output ends of the plurality of combiner boxes are connected to the inverter by using a direct current bus, the combiner box comprises at least one direct current switch and at least one DC-DC boost unit, an input end of the direct current switch is connected to the photovoltaic string, an output end of the direct current switch is connected to an input end of the DC-DC boost unit, an output end of the DC-DC boost unit is connected to an input end of the impedance detection apparatus, and an output end of the impedance detection apparatus is connected to the direct current bus; and the impedance detection apparatus is configured to:

sample a voltage between the direct current bus and a protective earthing at each of a first time point and a second time point, to obtain a first voltage value and a second voltage value; and sample a leakage current on the direct current bus at each of the first time point and the second time point, to obtain a first current value and a second current value; and calculate an insulation impedance value of the combiner box based on a difference between the first voltage value and the second voltage value and a difference between the first current value and the second current value, to determine whether impedance of the combiner box is abnormal;

after it is determined that the impedance of the combiner box is abnormal, adjust a maximum power point tracking (MPPT) voltage corresponding to the photovoltaic string in the combiner box;

sample the MPPT voltage at each of a third time point and a fourth time point, to obtain a first MPPT voltage value and a second MPPT voltage value; and sample the voltage between the direct current bus and the protective earthing at each of the third time point and the fourth time point, to obtain a third voltage value and a fourth voltage value; and calculate an insulation impedance value of the MPPT voltage based on the first MPPT voltage value, the second MPPT voltage value, the third voltage value, and the fourth voltage value, to determine whether impedance of the photovoltaic string is abnormal.

11. The photovoltaic system according to claim 10, further comprising:

a power supply unit, wherein one end of the power supply unit is grounded, the other end of the power supply unit is connected to the direct current bus, the power supply unit is in an off state at the first time point, and the power supply unit is in a working state at the second time point.

12. The photovoltaic system according to claim 11, wherein the impedance detection apparatus is further configured to:

turn on the power supply unit before the second voltage value and the second current value are obtained, so that the power supply unit is in the working state; and adjust the voltage between the direct current bus and the protective earthing to a first preset voltage.

13. The photovoltaic system according to claim 10, wherein the impedance detection apparatus is further configured to:

turn on the power supply unit before the first voltage value and the first current value are obtained, so that the power supply unit is in the working state; and adjust the voltage between the direct current bus and the protective earthing to a second preset voltage.

14. The photovoltaic system according to claim 13, wherein the impedance detection apparatus is further configured to:

adjust the voltage between the direct current bus and the protective earthing to a third preset voltage after first preset duration.

15. The photovoltaic system according to claim 10, wherein the impedance detection apparatus is further configured to:

after it is determined that the impedance of the combiner box is abnormal, adjust a maximum power point tracking (MPPT) voltage corresponding to the photovoltaic string in the combiner box;

sample the MPPT voltage at each of a third time point and a fourth time point, to obtain a first MPPT voltage value and a second MPPT voltage value; and sample the voltage between the direct current bus and the protective earthing at each of the third time point and the fourth time point, to obtain a third voltage value and a fourth voltage value; and calculate an insulation impedance value of the MPPT voltage based on the first MPPT voltage value, the second MPPT voltage value, the third voltage value, and the fourth voltage value, to determine whether impedance of the photovoltaic string is abnormal.

16. The photovoltaic system according to claim 15, wherein the impedance detection apparatus is further configured to:

adjust the MPPT voltage to a fourth preset voltage before the first MPPT voltage value and the third voltage value are obtained.

17. The photovoltaic system according to claim 16, wherein the impedance detection apparatus is further configured to:

adjust the MPPT voltage to a fifth preset voltage after second preset duration.

18. The photovoltaic system according to claim 10, wherein the power supply unit further comprises at least one of a relay, a resistor, a diode, or a direct current power supply.

* * * * *